US006964841B2

(12) United States Patent
Iihara et al.

(10) Patent No.: US 6,964,841 B2
(45) Date of Patent: Nov. 15, 2005

(54) DIRECTLY IMAGEABLE WATERLESS PLANOGRAPHIC PRINTING PLATE PRECURSOR

(75) Inventors: Akihiko Iihara, Otsu (JP); Ken Kawamura, Echi-Gun (JP); Mitsuru Suezawa, Koka-Gun (JP); Kimikazu Nagase, Otsu (JP)

(73) Assignee: Toray Industries, Inc., Tokyo (JP)

(*) Notice: Subject to any disclaimer, the term of this patent is extended or adjusted under 35 U.S.C. 154(b) by 0 days.

(21) Appl. No.: 10/372,769

(22) Filed: Feb. 26, 2003

(65) Prior Publication Data

US 2003/0175619 A1 Sep. 18, 2003

(30) Foreign Application Priority Data

Feb. 26, 2002 (JP) ....................................... 2002-050224
Jul. 25, 2002 (JP) ....................................... 2002-217102

(51) Int. Cl.$^7$ .................................................. G03F 7/11
(52) U.S. Cl. ............................... 430/273.1; 430/272.1; 430/278.1; 430/280.1; 101/454
(58) Field of Search .......................... 101/454; 430/138, 430/270.1, 271.1, 273.1, 272.1, 278.1, 280.1, 303

(56) References Cited

U.S. PATENT DOCUMENTS

| | | | | | |
|---|---|---|---|---|---|
| 5,919,600 | A | * | 7/1999 | Huang et al. | 430/272.1 |
| 6,284,433 | B1 | * | 9/2001 | Ichikawa et al. | 430/303 |
| 6,344,306 | B1 | * | 2/2002 | Fujiyoshi et al. | 430/272.1 |
| 2002/0045131 | A1 | * | 4/2002 | Nagase et al. | 430/292 |

FOREIGN PATENT DOCUMENTS

| | | |
|---|---|---|
| EP | 1038669 A | 9/2000 |

OTHER PUBLICATIONS

European Search Report dated May 17, 2005.

* cited by examiner

*Primary Examiner*—Barbara L. Gilliam
(74) *Attorney, Agent, or Firm*—Morrison & Foerster LLP

(57) ABSTRACT

The invention is a directly imageable waterless planographic printing plate precursor comprising: at least a heat insulating layer, a heat sensitive layer, and an ink repellent layer that are provided in that order on a substrate, wherein a transmittance of the heat insulating layer for a light having a wavelength within a range of 400 to 650 nm is at most 15% over the entire range of the wavelength. The invention provides a directly imageable waterless planographic printing plate precursor that allows measurement of the dot area ratio on the printing plate with a densitometer or the like.

7 Claims, No Drawings

DIRECTLY IMAGEABLE WATERLESS PLANOGRAPHIC PRINTING PLATE PRECURSOR

BACKGROUND OF THE INVENTION

The present invention relates to a directly imageable waterless planographic printing plate precursor which can be directly processed by a laser beam.

A generally termed direct imaging type process of producing an offset printing plate directly from an original without using a process film has begun to be employed in the fields of general offset printing and flexographic printing, as well as in the short run printing field, due to such features as simplicity requiring no high skill, speediness in obtaining a printing plate in a short time, and rationality of selectability from a variety of systems in accordance with quality and cost.

Especially recently, in response to the rapid progress of output systems such as prepress systems, image setters, laser printers, etc., new types of various planographic printing plate materials are being developed.

The processing methods for the planographic printing plates include methods of irradiating with a laser beam, methods of drawing with a thermal head, methods of locally applying a voltage by a pin electrode, methods of forming an ink repellent layer or an ink acceptable layer by ink jet, etc. Among them, the methods using a laser beam are superior to the other methods in resolution and processing speed, and are diverse.

The laser beam-adapted printing plates can be grouped into two types: a photon mode type that utilizes photoreactions, and a heat mode type that causes heat reactions through light-to-heat conversion. The heat mode type has an advantage of allowing handling in a daylight room. With fast progress of semiconductor lasers for use as the light source, usefulness of the heat mode type methods is lately reviewed.

With regard to the heat mode type waterless planographic printing plates, the following proposals have been made.

For example, U.S. Pat. Nos. 5,339,737 and 5,353,705, and EP 0580393, etc. disclose thermal-breakdown type directly imageable waterless planographic printing plates that use a laser beam as a light source.

A heat sensitive layer in these planographic printing plate precursors contains mainly carbon black as a laser beam absorbing compound, and nitrocellulose as a thermally decomposable compound. The laser beam absorbed by carbon black is converted into heat energy, and the heat destroys the heat sensitive layer. Finally, the destroyed area is removed by a development process, whereby a silicone rubber layer on the surface simultaneously falls off, thus forming an image area.

A problem of the thermal-breakdown type printing plate is that since the heat sensitive layer is destroyed to form an image, the ditch cells of the image area become deep so that the ink acceptability deteriorates at very small half tone dots. In addition, the ink mileage is low. Furthermore, since the heat sensitive layer is provided with a crosslinked structure in order to facilitate thermal breakdown, the printing plate is poor in printing durability. Still another problem is that this type of printing plate has low sensitivity, and therefore requires a high-intensity laser beam in order to destroy the heat sensitive layer.

As measures for removing these drawbacks, Japanese Patent Application Laid-Open Publication Nos. 2000-

330266 and HEI 11-268436 disclose waterless planographic printing plate precursors which have a heat sensitive layer and an ink repellent layer on a substrate, and allow formation of an image by reducing the adhesion between the heat sensitive layer and the ink repellent layer through conversion of the laser beam into heat. These patent applications also disclose provision of a heat insulating layer between the substrate and the heat sensitive layer.

Another requirement is the proofing by reading a printing plate with measuring apparatus, for example, by a method in which the reflection density of a printing plate is measured with a densitometer. However, the aforementioned known printing plates do not allow measurement of the dot area ratio on the printing plates through the use of a densitometer or the like.

SUMMARY OF THE INVENTION

It is an object of the invention to provide a directly imageable waterless planographic printing plate precursor that allows the dot area ratio thereof to be measured with a densitometer or the like.

The directly imageable waterless planographic printing plate precursor of the invention is a directly imageable waterless planographic printing plate precursor in which at least a heat insulating layer, a heat sensitive layer, and an ink repellent layer are provided in that order on a substrate, and the transmittance of the heat insulating layer for a light having a wavelength within a range of 400 to 650 nm is at most 15% over the entire range of the wavelength.

PREFERRED EMBODIMENTS

The invention will be described in detail below.

A directly imageable waterless planographic printing plate precursor in accordance with the invention has at least a heat insulating layer, a heat sensitive layer, and an ink repellent layer that are provided in that order on a substrate. A directly imageable waterless planographic printing plate precursor in accordance with the invention is subjected to an exposure process and a development process, whereby portions of the ink repellent layer are removed so as to produce a printing plate having a desired image thereon. The portions obtained by removing the ink repellent layer form image areas, and the portions where the ink repellent layer remains form non-image areas.

The heat sensitive layer serves to absorb a laser beam in the exposure process. The heat insulating layer serves to prevent heat generated by laser irradiation from transferring to a substrate during the exposure process.

It is desired that the proofing of a printing plate obtained as described above be carried out by reading with a measuring apparatus. An example of the method for proofing is a method in which after the exposure and development processes, the reflection density of the printing plate is read with a densitometer, and the dot area ratio on the printing plate is measured. However, with regard to the conventional printing plate precursors, measurements obtained with a densitometer vary to a great extent, and therefore the proofing by reading with a measuring apparatus is difficult.

Through intensive studies, the present inventors have found that the range of reflection densities with various measuring angles of the substrate has an adverse effect. If a roll-milled aluminum substrate is used as a substrate as is often the case, a range of reflection densities with various measuring angles occurs due to the effect of rolled grains formed on the aluminum substrate. Through studies of the inventors, it has been found that it is difficult to measure the dot area ratio on a printing plate with a densitometer if the range of reflection densities with various measuring angles is 0.04 or more.

The directly imageable waterless planographic printing plate precursor of the invention is characterized in that the light transmittance of the heat insulating layer with regard to all the wavelengths in the range of 400 to 650 nm is at most 15%. This light transmittance is preferably 10% or less, and more preferably 5% or less.

If the light transmittance of the heat sensitive layer regarding the entire wavelength range of 400 to 650 nm is 15% or less, the effect of the range of reflection densities with various measuring angles of the substrate can be curbed, and the dot area ratio on the printing plate can be measured with a densitometer or the like. If the light transmittance of the heat sensitive layer is above 15%, the effect of the range of reflection densities with various measuring angles of the substrate is significant so that the dot area ratio on the printing plate cannot be measured.

As for the substrate in the invention, a platy material having good dimensional stability is preferably used. Such dimensionally stable platy materials include materials that are conventionally used as printing plate substrates. As for the substrate, it is preferable to use paper, metallic plates of stainless steel, aluminum, etc., plastic films of polyester, polyethylene, polypropylene, etc., paper or plastic films having a laminate or vapor-deposition of a metal such as aluminum, etc. Among these substrate materials, aluminum plates are excellent in dimensional stability, and are inexpensive, and therefore are particularly preferable.

The invention is particularly effective if the substrate is an aluminum substrate that is not subjected to a surface-graining process after being roll-milled. With regard to such substrates, the range of reflection densities with various measuring angles measured by a densitometer is normally at least 0.1. According to the directly imageable waterless planographic printing plate precursor of the invention, even if the range of reflection densities with various measuring angles of the substrate used is 0.1 or more, it is possible to achieve a range of reflection densities with various measuring angles of the printing plate precursor that is less than 0.04. Therefore, the proofing by reading the printing plate with a measuring apparatus is possible. Although a surface-graining process on an aluminum substrate can reduce the range of reflection densities with various measuring angles of the substrate, it is preferable to avoid the surface-graining process due to its high cost.

As for the method for measuring the light transmittance of the heat insulating layer, a visible spectrophotometer, as for example, may be used for measurement. The measurement can be accomplished by a transmission technique, but if the substrate is opaque, measurement can be accomplished by a reflection technique and converted as described in detail below. An example of such a visible spectrophotometer is a recording spectrophotometer U-3210 produced by Hitachi, Ltd. The reflection density can be measured by MACBETH RD-918 produced by GretagMacbeth, or the like.

Containment of a pigment in the heat insulating layer is effective in order to achieve the range of light transmittance of the heat insulating layer regarding the wavelengths of 400 to 650 nm according to the invention. As for the pigment, it is preferable to use inorganic white pigments such as titanium oxide, zinc white, lithopone, etc., inorganic yellow pigments such as chrome yellow, cadmium yellow, yellow iron oxide, ochre, titan yellow, etc., organic yellow pigments, including azo pigments such as acetoacetic arylide-based monoazo pigments, acetoacetic arylide-based diazo pigments, condensation azo pigments, benzimidazolone-based monoazo pigments, etc., polycyclic pigments such as isoindolinone-based pigments, isoindoline-based pigments, vat pigments, perynone-based pigments, metal complex pigments, anthrapyrimidine-based pigments, acylamino-yellow-based pigments, quinophthalone-based pigments, flavanthrone-based pigments, etc. Among these white and yellow pigments, titanium oxide is particularly preferable in view of hiding power and coloring power.

A conventional directly imageable waterless planographic printing plate precursor in which the heat insulating layer contains a white pigment is also known. However, the containment of a white pigment in the heat insulating layer of this printing plate precursor is merely for the purpose of improving the ease of proofing by visual observation. Merely for the ease of visual proofing, there is no need for strict control of light transmittance, but mere color difference is required. However, it has been found that the heat insulating layer having a light transmittance prescribed in the invention is essential in order to measure the dot area ratio with a densitometer, particularly if the substrate exhibits a large range of reflection densities with various measuring angles.

As for the titanium oxide particles, there are particles of anatase type titanium dioxide, rutile type titanium dioxide, and brookite type titanium dioxide. The anatase type titanium dioxide and the rutile type titanium dioxide are preferable in view of stability. It is also possible to use a titanium oxide surface-treated with aluminum, silicon, titanium, zinc, zirconium, etc. Specific examples of such titanium oxides are Tipaque® R-820, R-830, R-930, R-550, R-630, R-680, R-670, R-580, R-780, R-780-2, R-850, R-855, A-100, A-220, W-10, CR-50, CR-50-2, CR-57, CR-80, CR-90, CR-93, CR-95, CR-953, CR-97, CR-60, CR-60-2, CR-63, CR-67, CR-58, CR-58-2, and CR-85 by Ishihara Sangyo Kaisya, ltd., and JR-301, JR-40, JR-405, JR-600A, JR-605, JR-600E, JR-603, JR-805, JR-806, JR-701, JRNC, JR-800, JR, JA-1, JA-C, JA-3, JA-4, JA-5 produced by Tayca Corporation, etc. However, the titanium oxide in the invention is not limited to these examples.

As for the titanium oxide particles used in the invention, it is preferable that the primary particle size be 0.2 to 0.3 $\mu$m. If the primary particle size of the titanium oxide particles is equal to or greater than 0.2 $\mu$m, an intended hiding power can be achieved. If the primary particle size is smaller than or equal to 0.3 $\mu$m, it is possible to obtain a heat insulating layer composition liquid with stable dispersion in which natural precipitation does not readily occur. Therefore, a good coating with high gloss can be obtained.

The amount of the titanium oxide added is preferably at least 2% by volume in the heat insulating layer. More preferably, the amount is 3% or more by volume, and 30% or less by volume. If the amount of the titanium oxide added is 2% or more by volume, a good hiding characteristic can be achieved. If the amount is 30% or less by volume, a good coating characteristic is exhibited.

In the invention, the titanium oxide particle surfaces may be treated with a titanate-based coupling agent. The surface treatment of titanium oxide particles improves the dispersibility of the titanium oxide particles, and allows addition of a large amount of titanium oxide particles. Furthermore, a coating solution containing the titanium oxide particles acquires a good dispersion stability.

Specific examples of the titanate-based coupling agent include isopropyl triisostearoyl titanate, isopropyl tri-n-stearoyl titanate, isopropyl trioctanoyl titanate, isopropyl tridodecylbenzenesulfonyl titanate, isopropyl tris(dioctyl pyrophosphite)titanate, tetraisopropyl bis(dioctyl phosphite) titanate, tetraoctylbis(ditridecylphosphite)titanate, tetra(2,2-diallyloxymethyl-1-butyl)bis(di-tridecyl)phosphite titanate, bis(dioctyl pyrophosphate)oxyacetate titanate, bis(dioctyl pyrophosphate)ethylene titanate, tris(dioctyl pyrophosphate)ethylene titanate, isopropyl dimethacrylisostearoyl titanate, isopropyl isostearoyldiacryl titanate, isostearoyl tri(dioctyl phosphate)titanate, isopropyl, isopropyl tricumylphenyl titanate, isopropyl tri(N-aminoethylaminoethyl)titanate, dicumylphenyl oxyacetate titanate, diisostearoyl ethylene titanate, isopropyl diisostearoylcumylphenyl titanate, isopropyl distearoyl methacryl titanate, isopropyl diisostearoyl acryl titanate, isopropyl 4-aminobenzeneulfonyl di(dodecylbenzenesulfonyl) titanate, isopropyl trimethacryl titanate, isopropyl di(4-aminobenzoyl)isostearoyl titanate, isostearoyl tri(dioctyl pyrophosphate)titanate, isopropyl triacryl titanate, isopropyl tri(N,N-dimethylethylamino)titanate, isopropyl trianthranyl titanate, isopropyl octyl, butyl pyrophosphate titanate, isopropyl di(butyl, methylpyrophosphate)titanate, tetraisopropyl di(dilauroyl phosphite)titanate, diisopropyl oxyacetate titanate, isostearoyl methacryl oxyacetate titanate, isostearoyl acryloxyacetate titanate, di(dioctyl phosphate) oxyacetate titanate, 4-aminobenzenesulfonyldodecylbenzenesulfony oxyacetate titanate, dimethacryl oxyacetate titanate, dicumylphenolate oxyacetate titanate, 4-aminobenzoylisostearoyl oxyacetate titanate, diacryl oxyacetate titanate, di(octyl, butyl pyrophosphate)oxyacetate titanate, isostearoylmethacrylethylene titanate, di(dioctyl phosphate)ethylene titanate, 4-aminobenzenesulfonyldodecylbenzenesulfonylethylene titanate, dimethacrylethylene titanate, 4-aminobenzoylisostearoylethylene titanate, diacrylethylene titanate, dianthranylethylene titanate, di(butyl, methylpyrophosphate)ethylene titanate, titanium allylacetoacetate triisopropoxide, titanium bis(triethanolamine) diisopropoxide, titanium di-n-butoxide(bis-2,4-pentanedionate), titanium diisopropoxide bis (tetramethylheptanedionate), titanium diisopropoxide bis (ethylacetoacetate), titanium methacryloxyethylacetoacetate triisopropoxide, titanium methylphenoxide, titanium oxide bis(pentanedionate), etc., and further include "KR TTS", "KR 46B", "KR 55", "KR 41B", "KR 138S", "KR 238S", "338X", "KR 44", "KR 9SA", etc. produced by Ajinomoto Co., Inc. However, the titanate-based coupling agent used in the invention is not limited to the above-listed agents.

The methods of treating a titanium oxide with a titanate-based coupling agent are roughly divided into two types: a wet method and a dry method. In an example of the wet method, titanium oxide particles are added into a solution obtained by diluting a titanate-based coupling agent with a solvent capable of dissolving the coupling agent, and the mixture is agitated by a homogenizer or the like, thus obtaining a titanate-based coupling agent-treated titaniumoxide dispersion. A titanate-based coupling agent-treated titanium oxide dispersion can also be obtained by adding glass beads, and agitating the mixture with a paint shaker or the like, and then removing the glass beads and the like by filtration through a filter capable of separating glass beads and the like. In this case, heating is also a possible process. In an example of the dry method, a titanate-based coupling agent-treated titanium oxide can be obtained by adding a titanium oxide into a Henschel mixer, and pre-drying at 95° C. for 20 minutes, and then adding a titanate-based coupling agent, and then revolving the mixture at 1200 rpm while maintaining a temperature of 60 to 80° C.

The amount of the titanate-based coupling agent used for treatment of the titanium oxide is preferably at least 0.001 g and at most 1 g with respect to 100 g of the titanium oxide. If the amount of the coupling agent is at least 0.001 g and at most 1 g, an effect of improving dispersibility will be achieved. A more preferable amount of the coupling agent is at least 0.05 g and at most 0.5 g.

It is preferable that the heat insulating layer contain an epoxy resin and a metal chelate compound. A heat insulating layer containing an epoxy resin and a metal chelate has a high-speed hardenability because secondary hydroxyl groups in epoxy resin molecules readily undergo exchange reactions with ligands in the metal chelate compound, and because the metal chelate compound catalytically functions in polymerization of the epoxy resin.

Furthermore, hydroxyl groups and glycidyl groups in epoxy resin molecules form hydrogen bonds and covalent bonds with hydroxyl groups, carboxyl groups, etc. on the substrate surface, so that the adhesion between the heat insulating layer and the substrate improves. The metal chelate compound also contributes to improved adhesion of the heat insulating layer to the substrate as the compound forms chemical bonds with hydroxyl groups, carboxyl groups, etc., on the substrate surface. Therefore, a heat insulating layer formed by using a metal chelate compound and an epoxy resin having at least two hydroxyl groups in a molecule adheres firmly to the substrate.

Still further, the unreacted portions of the metal chelate compound and the epoxy resin-derived secondary hydroxyl groups not involved in reactions which exist on the heat insulating layer surface form chemical bonds with crosslinkers, active hydrogen-containing compounds, etc., present in the heat sensitive layer, thereby enhancing the adhesion between the heat insulating layer and the heat sensitive layer. An epoxy resin having at least two hydroxyl groups in a molecule is particularly preferable.

The epoxy resin used in the invention may include a phenoxy resin (macromolecular epoxy resin).

It is preferable that the epoxy resin used in the invention be a bisphenol type epoxy resin represented by general formula (I)

(I)

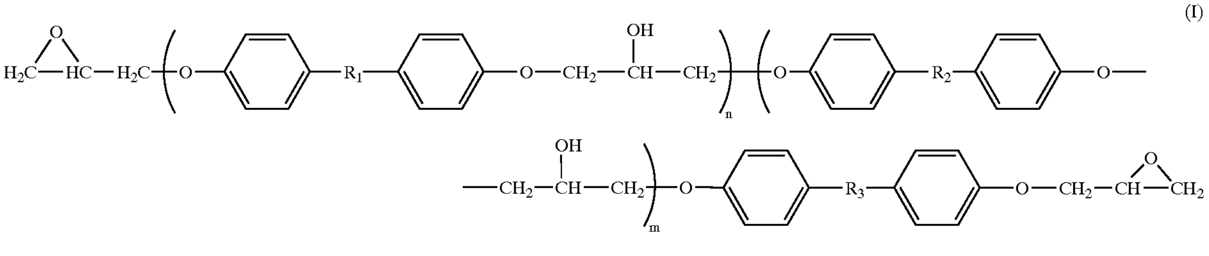

(In the formula, $R_1$, $R_2$, $R_3$ are species selected from those represented by the following formulas, and may be the same or different, and m, n are integers greater than or equal to 0, and m+n≧2).

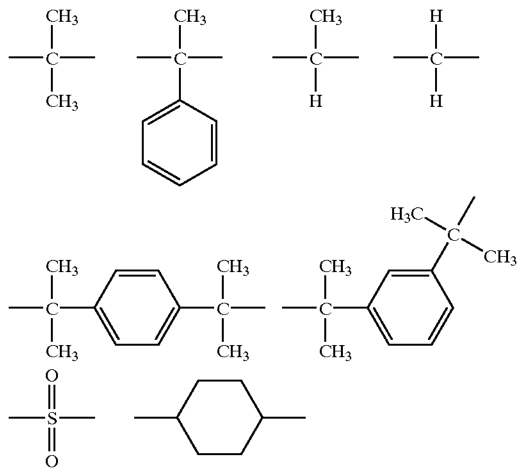

For the purpose of providing flame retardancy, a brominated bisphenol type epoxy resin may be used. Specific examples of the bisphenol type epoxy resin include "Epikote®" 1001, 1002, 1003, 1055, 1004, 1004AF, 1007, 1009, 1010, 1003F, 1004F, 1005F, 1006F, 1100L, 4004P, 4007P, 4010P, 5051, 5054, 5057, 5203, 5354, 1256, 4250, 4275 produced by Japan Epoxy Resins Co., ltd., and "Epotohto®" YD-011, YD-012, YD-013, YD-014, YD-017, YD-019, YD-020N, YD-020H, YD-7011R, YD-7017, YD-7019, YD-901, YD-902, YD-903N, YD-904, YD-907, YD-909, YD-927H, YD-6020, YDF-2001, YDF-2004, YDB-405, ST-5080, ST-5100, Phenotohto YP-50, YP-50S, YPB-40AM40 produced by Tohoto Kasei Co., ltd. However, the bisphenol type epoxy resin is not limited to the above-listed epoxy resins. Among these epoxy resins, epoxy resins having an epoxy equivalent of at least 600 are preferable. If the epoxy equivalent is 600 or more, good hardenability is exhibited. The epoxy equivalent herein refers to the number of grams of a resin containing 1 gram equivalent of epoxy groups.

Examples of the metal chelate compound in the invention include organic complex salts in which an organic ligand is coordinate-bonded to a metal, organic inorganic complex salts in which an organic ligand and an inorganic ligand are coordinate-bonded to a metal, and metal alkoxides in which a metal and an organic molecule are covalent-bonded via oxygen.

Examples of a metal forming the organic complex compound include Cu(I), Ag(I), Hg(I), Hg(II), Li, Na, K, Be(II), B(III), Zn(II), Cd(II), Al(III), Co(II), Ni(II), Cu(II), Ag(II), Au(III), Pd(II), Pt(II), Ca(II), Sr(II), Ba(II), Ti(IV), V(III), V(IV), Cr(III),Mn(II), Mn(III), Fe(II), Fe(III), Co(III), Pd(IV), Pt(IV), Sc(III), Y(III), Si(IV), Sn(II), Sn(IV), Pb(IV), Ru(III), Rh(III), Os(III), Ir(III), Rb, Cs, Mg, Ni(IV), Ra, Zr(IV), Hf(IV), Mo(IV), W(IV), Ge, In, lanthamide, actinide, etc. Preferable among these are Al, Ti, Mn, Fe, Co, Ni, Cu, Zn, Ge, In, Sn, Zr, Hf. Al and Zr are preferable in view of less tinting characteristic. Particularly preferable is Al in view of reactivity.

Examples of the ligand are compounds having coordinate groups as listed below having O (oxygen atom), N (nitrogen atom), S (sulfur atom) as a donor atom.

Specific examples of the coordinate group include: as coordinate groups having an oxygen atom as a donor atom, —OH (alcohol, enol and phenol), —COOH (carboxylic acid), >C═O (aldehyde, ketone, quinine), —O— (ether), —COOR (ester), —N═O (nitroso compounds, N-nitroso compounds), $—NO_2$ (nitro compounds), >N—O (N-oxide), $—SO_3H$ (sulfonic acid), $—PO_3H_2$ (phosphorous acid), etc.; as coordinate groups having a nitrogen atom as a donor atom, $—NH_2$ (primary amine, amide, hydrazine), >NH (secondary amine, hydrazine), >N— (tertiary amine), —N═N— (azo compounds, heterocyclic compounds), ═N—OH (oxime), $—NO_2$ (nitro compounds), —N═O (nitroso compounds), >C═N— (Schiff base, heterocyclic compounds), >C═NH (aldehyde, ketonimine, enamines), etc.; and, as coordinate groups having a sulfur atom as a donor atom, —SH (thiol), —S— (thioether), >C═S (thioketone, thioamide), ═S— (heterocyclic compounds), —C(═O)—SH or —C(═S)—OH and —C(═S)—SH (thiocarboxylic acid), —SCN (thiocynate, isothiocyanate), etc. The ligand is typically a ligand that contains at least two coordinate groups as listed above and that form at least one cyclic structure with a metal. Specific examples of such a ligand include β-diketones, keto esters, diesters, hydroxycarboxylic acid and its esters and salts, keto alcohols, amino alcohols, enolic active hydrogen compounds, etc. However, the listed ligands are not restrictive.

Specific compounds as the aforementioned ligand include, for example, the following compounds.

(1) β-diketones: 2,4-pentanedione, 2,4-heptanedione, trifluoroacetylacetone, hexafluoroacetylacetone, dibenzoylmethane, benzoylacetone, benzoyltrifluoroacetone, etc.

(2) keto esters: methyl acetoacetate, ethyl acetoacetate, butyl acetoacetate, octyl acetoacetate, etc.

(3) diesters: dimethylmalonate, diethylmalonate, etc.

(4) hydroxycarboxylic acid and its esters and salts: lactic acid, methyl lactate, ethyl lactate, ammonium lactate salt, salicylic acid, methyl salicylate, ethyl salicylate, phenyl salicylate, malic acid, methyl malate, ethyl malate, tartaric acid, methyl tartrate, ethyl tartrate, etc.

(5) keto alcohols: 4-hydroxy-4-methyl-2-pentanone, 4-hydroxy-2-pentanone, 4-hydroxy-2-heptanone, 4-hydroxy-4-methyl-2-heptanone, etc.

(6) amino alcohols: monoethanolamine, diethanolamine, triethanolamine, N-methyl-monoethanolamine, N-ethyl-monoethanolamine, N-dimethylethanolamine, N-diethylethanolamine, etc.

(7) enolic active hydrogen compounds: methylol melamine, methylolurea, methylolacrylamide, etc.

The metal chelate compound used in the invention may have a ligand as listed above. Preferable metal chelate compounds are aluminum chelate compounds in which at least one ligand selected from alcohols, phenols, enols, diesters, and keto esters is coordinate-bonded. Since such an aluminum chelate compound readily undergoes exchange reactions with an active hydrogen-containing compound, sublimation or evaporation of the aluminum chelate compound during heating can be curbed.

It is particularly preferable to use an aluminum chelate compound in which at least two keto esters are coordinate-bonded. The use of such an aluminum chelate compound reduces the susceptibility to moisture, and remarkably improves the storage stability of the heat insulating layer composition liquid.

As for the proportions of the epoxy resin and the metal chelate compound added, it is preferable to add the two compounds at such proportion that the compounds sufficiently react, and become insoluble. If unreacted epoxy resin or metal chelate compound remains, the unreacted portion is extracted into the heat sensitive layer composition liquid at the time of application of the composition liquid, so that the performance of the printing plate may be adversely affected.

A specific example of the adding proportion is as follows. If bisphenol A-type epoxy resin (molecular weight of 5,500) and aluminum-tris-acetylacetonate (molecular weight of 324.3), the adding proportion of bisphenol A-type epoxy resin to aluminum-tris-acetylacetonate is preferably within the range of 95 parts by weight:5 parts by weight to 60 parts by weight:40 parts by weight. Within this range of adding proportion, the two compounds can sufficiently react and become insoluble, so that the performance of the printing plate will not be adversely affected.

The heat insulating layer in the invention may contain phenol resin, acryl resin, alkyd resin, polyester resin, polyamide resin, urea resin, polyvinyl butyral resin, casein, gelatin, etc., as well as epoxy resin, a metal chelate compound and an titanium oxide.

For the purpose of improving coatability, it is possible to add into the heat insulating layer an alkylether (e.g., ethyl cellulose, methyl cellulose, etc.), a fluorochemical surfactant, silicone-based surfactant, or a nonionic surfactant.

For the purpose of enhancing the flexibility of the heat insulating layer, it is possible to add a flexibilizer such as natural rubber, synthetic rubber, polyurethane, etc. The amount of the flexibilizer added is preferably 10 to 70% by weight, and more preferably 20 to 60% by weight. If the amount of the flexibilizer is at least 10% by weight, the flexibility of the heat insulating layer improves. If the amount is at most 70% by weight, the inhibition of the curing reaction between the epoxy resin and the metal chelate compound is little, and is substantially ignorable.

The components that form the heat insulating layer are preferably dissolved through the use of a solvent. It is preferable that the solvent used for the heat insulating layer composition liquid have a property of well dissolving metal chelate compounds, epoxy resins, and other additives. It is possible to use only one solvent or use a mixture of two or more kinds of solvents. If a pigment is added, it is preferable to select a solvent that well wets the pigment surface and provides good pigment dispersibility.

In an example of the preparation method for the heat insulating layer composition liquid, a titanium oxide dispersion is put into a container, and after agitation is started, an epoxy resin, a metal chelate compound and other additives are sequentially added to obtain a high-concentration heat insulating layer composition liquid. After that, the composition liquid is diluted with a solvent to an arbitrary concentration, thus providing a heat insulating layer composition liquid.

The titanium oxide dispersion can be obtained by, for example, adding titanium oxide into a solvent, and then dispersing titanium oxide by a paint shaker, a ball mill, or the like.

The thickness of the heat insulating layer in the invention is preferably 1 to 30 μm, and more preferably 2 to 20 μm. If the thickness is at least 1 μm, hiding characteristic can be achieved. If the thickness is at most 30 μm, an economic advantage can be achieved.

If an aluminum chelate compound is used, it is preferable that the content ($B_1$) of aluminum atoms in the heat insulating layer processed at a cure temperature of 230° C. for a cure time of 1 minute after being formed at a temperature below 40° C. satisfies an expression below in relation to the content ($A_1$) of aluminum atoms in the heat insulating layer processed at a cure temperature of 40° C. for a cure time of 1 minute after being formed at a temperature below 40° C.

$$(B_1/A_1)\times 100 \geqq 90$$

If this condition is satisfied, there is no sublimation nor evaporation attributed to aluminum compounds during production of the heat insulating layer. Therefore, no aluminum compound deposition occurs in an oven used for the production, so that the heat insulating layer can be stably produced.

The content of aluminum atoms in the heat insulating layer can be determined through measurement of the Al-Kα intensity with fluorescent X-rays. The measurement method is detailed below.

Measurement device: Automatic X-ray Fluorescence Spectrometer RIX 3000 by Rigaku Corporation Measurement Conditions X-ray tube: Rh tube voltage/tube current: 50 kV/50 mA analytical line: Al-Kα dispersive crystal: PET detector: gas flow proportional counter measurement atmosphere: vacuum measuring surface: 30 mmϕ

Sample preparation and measurement: Sample pieces of about 35 mm per side were fixed to measuring sample cells. Each sample was subjected to measurement repeatedly twice (a fixed time count method, a count time of 40 seconds).

Next described will be the heat sensitive layer employed in the directly imageable waterless planographic printing plate precursor of the invention.

The material that forms the heat sensitive layer is not particularly limited. However, it is preferable that the material contain: (a) a compound decomposable by the effect of laser irradiation, and (b) a thermosetting compound.

(a) Examples of the compound decomposable by the effect of laser irradiation include: (1) a compound that does not absorb laser light, but that decomposes due to the effect of another compound that absorbs laser light; and (2) a compound that absorbs laser light, and therefore decomposes.

(1) Examples of the compound that does not absorb laser light but that decomposes due to the effect of another compound that absorbs laser light include: ammonium nitrate, potassium nitrate, sodium nitrate, carbonate ester compounds, nitro compounds such as nitrocellulose and the like, organic peroxides such as benzoyl peroxide, perbenzoate ester and the like, inorganic peroxides, polyvinylpyrrolidone, azo compounds such as azodicarbonamide, azobisisobutyronitrile and the like, nitroso compounds such as N-N'-dinitroso pentamethylenetetramine and the like, azide compounds, diazo compounds, sulfonyl hydrazine compounds such as p-toluenesulfonylhydrazine, p,p'-oxybis(benzenesulfohydrazine), etc., and other low-molecular and high-molecular hydrazine derivatives, etc. Furthermore, a compound that produces amines due to the effect of laser light, and a compound that decomposes due to the effect of amine or acid produced may also be used in the invention. This compound may be added in an amount of, preferably, 0.1 to 70% by weight, and more preferably, 1 to 50% by weight, and still more preferably, 5 to 30% by weight, with respect to the total solid of the heat sensitive layer.

As other compounds that absorb laser light, known light-to-heat converting substances may be named. Specific examples of the light-to-heat converting substances include: black pigments such as carbon black, titanium black, aniline black, cyanine black, ect., green pigments of phthalocyanine and naphthalocyanine, carbon graphite, diamine metal complexes, dithiol metal complexes, phenolthiol metal complexes, mercaptophenol metal complexes, crystal water-containing inorganic compounds, copper sulfate, chromium sulfide, silicate compounds, metal oxides such as titanium oxide, vanadium oxide, manganese oxide, iron oxide, cobalt oxide, tungsten oxide, etc., hydroxides and sulfates of these metals, etc. Among them, carbon black is preferable in view of light-to-heat conversion rate, economy and handling convenience.

Coloring matters and, in particular, dyes that absorb infrared or near-infrared are preferably used. Particularly preferable coloring matters include cyanin-based colors, phthalocyanine-based colors, naphthalocyanin-based colors, dithiol metal complex-based colors, azulenium-based colors, squarylium-based colors, croconium-based colors, azo-based dispersed colors, bisazo-based colors, bisazostilbene-based colors, naphthoquinone-based colors, anthraquinone-based colors, perylene-based colors, polymethine-based colors, indoaniline metal complex dyes, intermolecular type CT-based colors, benzothiopyran-based colors, spiropyran-based colors, nigrosine-based colors, thioindigo-based colors, nitroso-based colors, quinoline-based colors, fulgide-based colors. Particularly, dyes are preferably used.

The content of the light-to-heat converting substance is preferably 1 to 40% by weight, and more preferably, 5 to 25% by weight with respect to the total heat sensitive layer composition. If the content of the light-to-heat converting substance is less than 1% by weight, improvement in the sensitivity to laser light is not exhibited. If the content is greater than 40% by weight, the printing durability of a printing plate is likely to deteriorate.

(2) Examples of the compound that absorbs laser light and decompose include relatively easily decomposable dyes and pigments selected from the aforementioned pigments and dyes that perform the aforementioned light-to-heat conversion. Particularly preferable compounds include cyanin-based colors, phthalocyanine-based colors, naphthalocyanin-based colors, dithiol metal complex-based colors, azulenium-based colors, squarylium-based colors, croconium-based colors, azo-based dispersed colors, bisazo-based colors, bisazostilbene-based colors, naphthoquinone-based colors, anthraquinone-based colors, perylene-based colors, polymethine-based colors, indoaniline metal complex dyes, intermolecular type CT-based colors, benzothiopyran-based colors, spiropyran-based colors, nigrosine-based colors, thioindigo-based colors, nitroso-based colors, quinoline-based colors, fulgide-based colors. Particularly, dyes are preferably used. The content of the light-to-heat converting substance is preferably 1 to 40% by weight, and more preferably, 5 to 25% by weight with respect to the total heat sensitive layer composition. If the content of the light-to-heat converting substance is less than 1% by weight, improvement in the sensitivity to laser light is not exhibited. If the content is greater than 40% by weight, the printing durability of a printing plate is likely to deteriorate.

Preferable examples of the compound (a) decomposable by the effect of laser irradiation include polymethine-based near-infrared absorbing dyes, phthalocyanine-based near-infrared absorbing dyes, cyanine-based near-infrared absorbing dyes, dithiol metal complex-based near-infrared absorbing dyes, etc. Also preferred is a combination of a near-infrared absorbing dye as mentioned above and at least one species selected from azo compounds, azide compounds, diazo compounds, and hydrazine derivatives.

In the invention, it is preferable that the heat sensitive layer contain a thermosetting compound (b). Conventionally, in the directly imageable waterless planographic printing plates having a heat sensitive layer and an ink repellent layer in that order, some attempts have been made to produce a type of a printing plate in which the adhesion between the heat sensitive layer and the ink repellent layer is improved by laser irradiation utilizing the techniques of polymerization, crosslinking and the like. In all the conventional cases where a thermosetting compound is employed in a generally-termed negative-type printing plate precursor in which the adhesion between the heat sensitive layer and the ink repellent layer is reduced by laser irradiation, the thermosetting compound is used in order to introduce a crosslinked structure in the heat sensitive layer during production of the precursor.

In the invention, the thermosetting compound (b) refers to a group of compounds that, when present in the heat sensitive layer of a printing plate precursor, will retain capability of thermosetting in a direct or indirect fashion in response to the effect of laser irradiation. Examples of the thermosetting compound (b) include novolac resins and resole resins obtained through condensation reactions between formaldehyde and phenols such as phenol, cresol, xylenol, etc., phenol-furfural resins, furan resins, unsaturated polyesters, alkyd resins, urea resins, melamine resins, guanamine resins, epoxy resins, diallyl phthalate resins, unsaturated polyurethane resins, polyimide precursors, etc. However, these substances are not restrictive.

Besides the aforementioned resins that undergo reactions, a composition obtained by adding a heat-reactive crosslinker to a compound having a reactive functional group may also be used as a thermosetting compound (b) in the invention. Examples of the crosslinker include known multifunctional compounds having crosslinking characteristic, that is, multifunctional blocked isocyanate, multifunctional epoxy compounds, multifunctional acrylate compounds, metal chelate compounds, multifunctional aldehydes, multifunctional mercapto compounds, multifunctional alkoxysilyl compounds, multifunctional amine compounds, multifunctional carboxylic acids, multifunctional vinyl compounds, multifunctional diazonium salts, multifunctional azide compounds, hydrazine, etc. In order to accelerate the reaction of the aforementioned crosslinking agent, a known catalyst may be added. The crosslinking agents as mentioned above may be used either singly or in a mixture of two or more species.

Furthermore, as the thermosetting compound (b), a compound that generates an acid or an amine due to the effect of heat, or a compound that hardens due to the effect of the acid or amine generated may also be used in the invention. Particularly preferable among such thermosetting compounds is a combination of a phenol resin and a metal chelate compound.

The proportion of the thermosetting compound (b) in the heat sensitive layer is preferably 10 to 95% by weight, and more preferably 30 to 70% by weight with respect to the total solid of the heat sensitive layer. If the amount of the thermosetting compound is less than 10% by weight, the improvement in the solvent resistance of the image area heat sensitive layer due to the thermosetting of the heat sensitive layer becomes very little in some cases. If the amount of the thermosetting compound is larger than 95% by weight, a problem may arise in the image formability by laser irradiation because of relatively reduced amounts of heat-decomposable compounds and light-to-heat converting substances.

The heat sensitive layer may further contain a binder polymer, a surfactant, and various additives.

Examples of the binder polymer include homopolymers and copolymers of acrylate esters and metacrylate esters such as polymethyl metacrylate, polybutyl metacrylate, etc., homopolymers and copolymers of styrene-based monomers such as polystyrene, α-methylstyrene, hydroxylstyrene, etc., various synthetic rubbers of isoprene, styrene-butadiene, etc., homopolymers and copolymers of vinyl esters such as polyvinyl acetate, polyvinyl chloride, etc., polyoxides (polyethers) such as polyethylene oxide, polypropylene oxide, etc., polyesters, polyurethanes, polyamides, cellulose derivatives such as ethyl cellulose, cellulose acetate, etc., phenoxy resins, methylpentene resins, polyparaxylylene resins, polyphenylene sulfide resins, etc.

The content of the binder polymer is preferably 5 to 70% by weight, and more preferably 10 to 50% by weight with respect to the total heat sensitive layer composition. If the binder polymer content is less than 5% by weight, problems are likely to occur in printing durability and coatability of coating liquid. If the content is greater than 70% by weight, the image reproducibility will likely be adversely affected.

The thickness of the heat sensitive layer is preferably 0.1 to 10 $g/m^2$ in terms of weight in view of good printing durability of the printing plate, easy volatilization of a diluting solvent, and good productivity. A more preferable thickness is 0.5 to 7 $g/m^2$.

When a directly imageable waterless planographic printing plate precursor having a heat sensitive layer as mentioned above is irradiated with laser light, the compound (a) decomposable by the effect of laser light decomposes due to the function of the light-to-heat converting substance on a surface of the heat sensitive layer which surface contacts the ink repellent layer. In some cases, the light-to-heat converting substance itself decomposes due to the effect of laser light. It is preferable that at the time of the decomposition, a gas, such as nitrogen, oxygen, etc., be generated. Due to the decomposition of the compound and the effect of the gas, the adhesion between the ink repellent layer and the heat sensitive layer is effectively reduced. Inside the heat sensitive layer at a laser-irradiated site, the hardening of the thermosetting compound (b) progresses. As a result, the solvent resistance of the heat sensitive layer of laser-irradiated sites is enhanced. Therefore, in a development process that follows, the ink repellent layer and only the surface of the heat sensitive layer (the surface contacting the ink repellent layer) are removed from the laser-irradiated sites, so that most portions of the heat sensitive layer remain.

In the thus-obtained printing plate, the laser-irradiated portions form image areas, and non-irradiated portions form non-image areas. The heat sensitive layer in the image areas has high solvent resistance due to the crosslinked structure. Furthermore, since the heat sensitive layer remains, the ditch cell depth is small. For these factors, the printing plate has merits of being excellent in the small dot reproducibility and the ink mileage.

Examples of the ink repellent layer in the invention include a hydrophilic layer formed of vinyl alcohol and the like, a hydrophilic layer containing an acrylic acid, an acrylate salt, sulfonic acid, a sulfonate salt, etc., a hydrophilic swollen layer proposed in Japanese Patent Application Laid-Open Publication Nos. HEI 8-282142, HEI8-282144, HEI 8-292558, HEI 9-54425, etc., a silicone rubber layer, a layer containing a fluorine compound, etc. A preferable ink repellent layer is a silicone rubber layer. The silicone rubber layer may be formed of either an addition type silicone rubber or a condensation type silicone rubber.

Preferable examples of components that form the addition type silicone rubber layer include vinyl group-containing polydimethylsiloxane, SiH group-containing polysiloxanes, and a reaction inhibitor and a curing catalyst for the purpose of controlling the hardening speed.

The vinyl group-containing polydimethylsiloxane has a structure represented by general formula (II), and have a vinyl group on a molecular end and/or within the main chain.

(II)

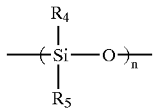

(In the formula, n represents an integer greater than 1, and $R_4$, $R_5$ represent at least one species selected from the group consisting of substituted or non-substituted alkyl groups having a carbon number of 1 to 50, substituted or non-substituted alkenyl groups having a carbon number of 2 to 50, and substituted or non-substituted aryl group having a carbon number of 4 to 50, and may represent the same group or different groups).

As for $R_4$, $R_5$ in the above formula, it is preferable that at least 50% of all be methyl groups, in view of ink repellency of the printing plate. The molecular weight of the vinyl group-containing polydimethylsiloxane may be in a range of several thousands to several hundred thousands. However, in view of handling ease, the ink repellency and the scratch resistance of the produced printing plate, etc., it is preferable to use a vinyl group-containing polydimethylsiloxane having a weight average molecular weight of 10,000 to 1,000,000. A more preferable range of the molecular weight is 50,000 to 600,000.

Examples of the SiH group-containing polysiloxane include compounds which have an SiH group in the molecular chain or at an terminal thereof, and which are represented by general formulas (III) to (VI).

(III)

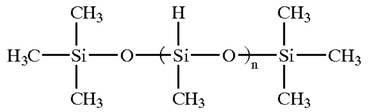

(IV)

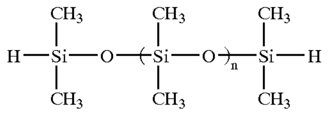

(V)

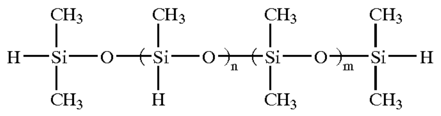

(VI)

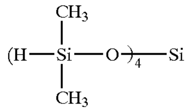

(In general formulas (III) to (VI), n is an integer greater than 1, and m is an integer greater than 0).

The amount of SiH groups in the SiH group-containing polysiloxane is preferably at least 2 in number, and more preferably at least 3 in number. The amount of the SiH group-containing polysiloxane added is preferably 0.1 to 20% by weight in the ink repellent layer, and more preferably 1 to 15% by weight. As for the quantity ratio of the SiH group-containing polysiloxane to polydimethylsiloxane, the molar ratio of SiH group/vinyl group of polydimethylsiloxane is preferably in the range of 1.5 to 30, and more preferably in the range of 10 to 20. If the molar ratio is less than 1.5, the hardening of the ink repellent layer may be insufficient in some cases. If the molar ratio exceeds 30, the physical property of the rubber becomes brittle, and the scratch resistance of the printing plate and the like will likely be adversely affected.

Example of the reaction inhibitor usable in the ink repellent layer include nitrogen-containing compounds, phosphorus-based compounds, unsaturated alcohols, etc. Acetylene-containing alcohols and the like are preferably used. A preferable amount of the reaction inhibitor is 0.01 to 10% by weight in the ink repellent layer. A more preferable amount is 0.1 to 5% by weight.

Examples of the curing catalyst usable in the ink repellent layer include group-III transition metal compounds. Preferable examples are platinum compounds. More specifically, examples of platinum compounds as the curing catalyst include platinum, platinum chloride, chloroplatinic acid, olefin coordinated platinum, alcohol modified complex of platinum, methylvinyl polysiloxane complex of platinum, etc. It is preferable that the amount of the curing catalyst be 0.01 to 20% by weight as the solid content in the ink repellent layer. A more preferable range is 0.1 to 10% by weight. If the amount of the catalyst added is smaller than 0.01% by weight, the ink repellent layer is cured insufficiently, and problems may arise in the adhesion to the heat sensitive layer. On the other hand, if the amount of the catalyst added is larger than 20% by weight, the pot life of the, ink repellent layer solution will be adversely affected. The amount of the metal such as platinum or the like in the ink repellent layer composition is preferably 10 to 1000 ppm, and more preferably 100 to 500 ppm.

In addition to the aforementioned compounds, the ink repellent layer may also contain a hydroxyl group-containing organopolysiloxane or hydrolyzable functional group-containing silane or siloxane, and a known filler such as silica or the like for the purpose of improving the rubber strength, and a silane coupling agent, a titanate-based coupling agent, or an aluminum-based coupling agent, etc. for improving the adhesion. Preferable silane coupling agents include alkoxysilanes, acetoxysilanes, ketoximinesilanes, etc. Particularly, a coupling agent having a vinyl group, or a ketoximinesilane is preferable.

The ink repellent layer may contain a hydroxyl group-containing polydimethylsiloxane, a crosslinking agent (de-acetic-acid type, de-oxime type, de-alcohol type, de-amine type, de-acetone type, de-amide type, de-aminoxy type, etc.), and a curing catalyst. The hydroxyl group-containing polydimethylsiloxane has a structure represented by general formula (II).

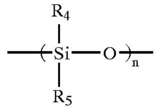

(II)

(In the formula, n represents an integer greater than 1, and $R_4$, $R_5$ represent at least one species selected from the group consisting of substituted or non-substituted alkyl groups having a carbon number of 1 to 50, substituted or non-substituted alkenyl groups having a carbon number of 2 to 50, and substituted or non-substituted aryl group having a carbon number of 4 to 50, and may represent the same group or different groups).

As for $R_4$ and $R_5$, it is preferable that at least 50% of all be methyl groups in view of the ink repellency of the printing plate. The hydroxyl groups may be positioned at molecular terminals and/or within the main chain. However, preferably used are polydimethylsiloxanes having hydroxyl groups on molecular terminals. As for the molecular weight, hydroxyl group-containing polydimethylsiloxanes having a molecular weight of several thousands to several hundred thousands may be used. However, in view of handling convenience, the ink repellency and the scratch resistance of the produced printing plate, etc., it is preferable to use a hydroxyl group-containing polydimethylsiloxane having a weight average molecular weight of 10,000 to 200,000. A more preferable range of the molecular weight is 30,000 to 150,000.

Examples of the crosslinking agent preferably usable in the ink repellent layer include acetoxysilanes, alkoxysilanes, ketoximinesilanes, allyloxysilanes, etc. represented by the following general formula (VII).

$$(R_6)_{4-n}SiX_n \qquad \text{(VII)}$$

(In the formula, n represents an integer of 2 to 4; $R_6$ represents a substituted or non-substituted alkyl group with 1 or more carbon atoms, alkenyl group, aryl group, or a group formed by combining the foregoing groups; and X represents a functional group selected from halogen atoms, alkoxy group, acyloxy group, ketoximine group, aminoxy group, amido group and alkenyloxy group.)

In the foregoing formula, it is preferable that the number n of the hydrolyzable groups is 3 or 4.

Specific compounds represented by general formula (VII) include methyltriacetoxysilane, ethyltriacetoxysilane, vinyltriacetoxysilane, methyltrimethoxysilane, methyltriethoxysilane, ethyltrimethoxysilane, ethyltriethoxysilane, tetraethoxysilane, tetrapropoxysilane, vinyltrimethoxysilane, vinyltriphenoxysilane, vinyltriethoxysilane allyltriethoxysilane, vinyltriisopropoxysilane, vinyltrisisopropenoxysilane, vinylmethylbis (methylethylketoximine)silane, methyltri(methylethylketomixine)silane, vinyltri(methylethylketoximine)silane, tetra(methylethylketoximine)silane, diisopropenoxydimethylsilane, triisopropenoxymethylsilane, tetraallyloxysilane, etc. However, the listed compounds are not restrictive. Among the compounds, acetoxysilanes or ketoximinesilanes are preferable in view of the curing rate of the ink repellent layer, handling convenience, etc.

The amount of addition of the crosslinking agent represented by general formula (VII) is preferably 1.5 to 20% by weight with respect to the entire composition of the ink repellent layer composition, and more preferably 3 to 10% by weight. As for the amount ratio of the crosslinking agent to the polydimethylsiloxane, it is preferable that the molar ratio of functional groups X/hydroxyl group of the polydimethylsiloxane is in the range of 1.5 to 10.0. If the molar ratio is smaller than 1.5, the ink repellent layer solution is likely to gelate. If the molar ratio is greater than 10.0, the physical properties of the rubber becomes fragile so that the scratch resistance, etc. of the printing plate will likely be adversely affected.

Examples of the curing catalyst usable in the ink repellent layer include acids such as organic carboxylic acids including acetic acid, propionic acid, maleic acid, etc., toluenesulfonic acid, boric acid, etc., alkalis such as potassium hydroxide, sodium hydroxide, lithium hydroxide, etc., amines, metal alkoxides such as titanium tetrapropoxide, titanium tetrabutoxide, etc., metal diketenates such as iron acetylacetonate, titaniumacetylacetonatedipropoxide, etc., organic acid salts of metals, etc. Among them, it is preferable to add an organic acid salt of a metal. Particularly preferable is an organic acid salt of a metal selected from tin, lead, zinc, iron, cobalt, calcium and manganese. Specific examples of such compounds include dibutyltin diacetate, dibutyltin dioctate, dibutyltin dilaurate, zinc octylate, iron octylate, etc. The amount of the curing catalyst is preferably 0.01 to 20% by weight as a solid content in the ink repellent layer, and more preferably 0.1 to 10% by weight. If the amount of the catalyst added is less than 0.01% by weight, the ink repellent layer is insufficiently cured, and problems may occur in the adhesion to the heat sensitive layer. If the amount of the catalyst added is larger than 20% by weight, the pot life of the ink repellent layer solution may be adversely affected.

In addition to the foregoing substances, the ink repellent layer may contain a known filler for improving the rubber strength, and may further contain a known silane coupling agent.

The film thickness of the silicone rubber layer is preferably 0.5 to 20 $g/m^2$, and more preferably 1 to 4 $g/m^2$ in terms of weight. If the film thickness is less than 0.5 $g/m^2$, the ink repellency, the scratch resistance and the printing durability of the printing plate tend to decline. If the film thickness is greater than 20 $g/m^2$ it is disadvantageous from an economic viewpoint, and the developability and ink mileage deteriorate.

A preferred production method for a directly imageable waterless planographic printing plate precursor in accordance with the invention will next be described.

A substrate is coated with a heat insulating layer composition using an ordinary coater such as a reverse roll coater, an air knife coater, a gravure coater, a die coater, a Meyer bar coater, etc., or a rotary coater such as a whirler, and the coating film is cured by heating at 100 to 300° C. for several minutes or irradiation with an active beam. Subsequently, an ink acceptable layer composition is applied, and the coating film is heated and dried at 50 to 180° C. for tens of seconds to several minutes, and is cured as required.

Then, a silicone rubber composition is applied, and the coating film is heat-treated at 50 to 200° C. for several minutes, to obtain an ink repellent layer.

Then, if necessary, a protective film may be laminated, or a protective layer may be formed, for the purpose of protecting the ink repellent layer. Examples of the protective film include polyester films, polypropylene films, polyvinyl alcohol films, ethylene-vinyl acetate copolymer saponificated matter films, polyvinylidene chloride films, etc.

A processing method of producing a printing plate from the directly imageable waterless planographic printing plate precursor obtained as described above will be described. The processing method normally includes at least (1) an exposure step, (2) a "pre-treatment step" of reducing the adhesion between the ink repellent layer and the heat sensitive layer at a laser-irradiated site, and (3) a "development step" of causing the ink repellent layer at the laser-irradiated site to fall off. It is also possible to add (4) a "post-treatment step" of dying the heat sensitive layer in the image areas with a stain solution, and (5) a "rinsing step" of completely rinsing the processing solution and the stain solution. Each step will be described in detail.

(1) Exposure Step

A directly imageable waterless planographic printing plate precursor is exposed to laser light for a desired image via the protective film, or after the protective film has been removed.

The laser light sources normally used in the exposure step are laser light sources whose emission wavelength region is within the range of 300 nm to 1500 nm. Among them, semiconductor lasers and YAG lasers whose emission wavelength regions are adjacent to the near-infrared region are preferably used. Specifically, laser light having a wavelength of 780 nm, 830 nm, and 1064 nm is preferably used for the processing of the plate in view of the ease of handling the printing material in a light room.

Due to laser irradiation, decomposition products are formed on the heat sensitive layer surface. Furthermore, due to laser irradiation, the curing of interior of the heat sensitive layer progresses.

(2) Pre-Treatment Step

The pre-treatment step is a step of dipping the printing plate, for a certain time, in a pre-treatment liquid kept at a predetermined temperature.

If the laser irradiation energy in the exposure step is great, the immediate proceeding to the development step while skipping the pre-treatment step will allow removal of the ink repellent layer from the laser-irradiated portions. However, if the irradiation energy is small, the modification of the heat sensitive layer is small, so that it is difficult to detect the ON/OFF states of laser irradiation solely through the development step, and therefore, development may be impossible. If the laser irradiation energy is increased, the energy needed for pattern formation on the printing plate becomes great. If the laser irradiation energy is excessively great, the heat sensitive layer is destroyed, and the heat sensitive layer is unlikely to remain after development. Thus, the aforementioned disadvantages in printing will result. Therefore, in order to amplify the ON/OFF difference of laser irradiation and allow development of low-energy laser-irradiated portions, the plate is treated with the pre-treatment liquid.

In the pre-treatment step, it is preferable that the plate be dipped in a pre-treatment liquid having a temperature of 30 to 60° C. for 10 to 100 seconds. If the plate is dipped in the pre-treatment liquid having a temperature below 30° C., or for a time shorter than 10 seconds, the swelling or dissolution of the heat sensitive layer is insufficient, so that the adhesion between the ink repellent layer and the heat sensitive layer cannot be sufficiently reduced. If the plate is dipped in a pre-treatment liquid having a temperature above 60° C., or for a time longer than 100 seconds, problems, for example, a problem of the heat sensitive layer falling off from the substrate, may occur in some cases.

When the plate is dipped in the pre-treatment liquid, the pre-treatment liquid permeate into the ink repellent layer, and finally reaches the heat sensitive layer. An upper portion of the heat sensitive layer in laser-irradiated areas has thermal decomposition products, or has an increased solubility in the pre-treatment liquid, so that the upper portion of the heat sensitive layer swells or partially falls off due to the pre-treatment liquid, and therefore, the adhesion between the ink repellent layer and the heat sensitive layer declines. If the printing plate in this state is lightly rubbed, the ink repellent layer in the laser-irradiated areas fall off, so that the heat sensitive layer underneath the ink repellent layer becomes exposed, and thus forms an ink acceptable layer. In the non-irradiated areas, the heat sensitive layer is insoluble or only slightly soluble in the pre-treatment liquid, so that the ink repellent layer remains firmly adhered to the heat sensitive layer, and will not fall off despite strong rubbing. In this manner, the ink repellent layer in the non-irradiated areas is not developed, and therefore repels ink. Thus, an image is formed on the waterless planographic printing plate.

Due to the above-described mechanism, the printing plate sensitivity is increased. Therefore, selection of a pre-treatment liquid is critical. If a pre-treatment liquid having a high power for dissolving the heat sensitive layer is used, the ink repellent layer in a non-irradiated area may also fall off, and the heat sensitive layer in the non-irradiated area may undergo a development process depending on the degree of the dissolving power. Therefore, the pre-treatment liquid is contaminated, and the service life of the pre-treatment liquid becomes short. Conversely, if a pre-treatment liquid having a low dissolving power for the heat sensitive layer is used, even the ink repellent layer in the irradiated areas cannot be developed, so that the sensitivity of the printing plate cannot be enhanced.

As the pre-treatment liquid, it is possible to use a liquid obtained by adding a polar solvent, such as alcohol, ketone, ester, carboxylic acid, amine, etc., into water, or a liquid obtained by adding a polar solvent into a solvent made up of at least one species selected from aliphatic hydrocarbons, aromatic hydrocarbons, etc., or use a polar solvent. It is preferable that a glycol ether compound or a glycol compound represented by the following general formula (VIII) be used as a major component.

(VIII)

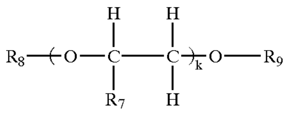

(where $R_7$ represents a hydrogen atom or an alkyl group with 1 to 5 carbon atoms; $R_8$ and $R_9$ represent a hydrogen atom or an alkyl group with 1 to 15 carbon atoms; and k is an integer of 1 to 12).

Generally, glycol ether compounds have higher dissolving power for the heat sensitive layer than glycol compounds. Therefore, by selecting an appropriate compound from the two groups or mixing compounds selected respectively from the two groups, it is possible to obtain a pre-treatment liquid having an optimal selective dissolution characteristic with respect to the plate in which the degree of hardening of the heat sensitive layer varies. As for the effect of the pre-treatment liquid, the swelling characteristic of the ink repellent layer is also involved as well as the heat sensitive layer selective dissolution power. If the ink repellent layer swells, the ink repellent layer can be relatively easily removed, so that development can be facilitated even if the pre-treatment liquid has low dissolution power for the heat sensitive layer. However, if the ink repellent layer excessively swells, abrasive marks will likely be formed during development. Therefore, the swelling of the ink repellent layer needs to be controlled within an appropriate range. Specifically, the swelling rate of the ink repellent layer is preferably at most 30%, and more preferably at most 10%. For example, the swelling rate of an ink repellent layer of a silicone rubber achieved by a glycol compound is appropriately 0%, and therefore the ink repellent layer is substantially not swollen. In this case, therefore, the selective dissolution characteristic for the heat sensitive layer affects the suitability of the pre-treatment liquid. If the repeating units, such as ethylene oxide, propylene oxide, etc., are less, and relatively long linear-chain functional groups are introduced as $R_8$ and $R_9$, the pre-treatment liquid's power for swelling the ink repellent layer becomes high. With regard to glycol monoethers and gylycol diethers, gylycol diethers generally have higher powers for swelling silicone rubber. In such a case, a pre-treatment liquid is designed taking into account the selective dissolution characteristic for the heat sensitive layer and the swelling power for silicone rubber.

Examples of the glycol compound include ethylene glycol, propylene glycol, butylenes glycol(1,2-butanediol), 2,3-butanediol, polyethylene glycol of k=2 to 12, polypropylene glycol of k=2 to 12, etc. These glycol compounds may be used either singly or in a mixture of two or more species. Among them, diethylene glycol, triethylene glycol, tetraethylene glycol, dipropylene glycol, tripropylene glycol and tetrapropylene glycol, whitch are represented by general formula (VIII) of k=2 to 4, are particularly preferably used as a pre-treatment liquid, in view of selective dissolution characteristic.

Examples of the glycol ether compound include monoalkyl ethers and dialkyl ethers of the aforementioned glycol compounds. Examples of the alkyl groups of $R_5$ and $R_6$ include methyl group, ethyl group, propyl group, iso-propyl group, butyl group, iso-butyl group, tert-butyl, heptyl group, hexyl group, heptyl group, octyl group, 2-ethylhexyl group, nonyl group, decanyl group, undecanyl group, and dodecanyl group. Preferably usable glycol ether compounds include diethylene glycol monomethyl ether (methylcarbitol), diethylene glycol monoethyl ether (ethylcarbitol), diethylene glycol monopropyl ether (propylcarbitol), diethylene glycol monobutyl ether (butylcarbitol), diethylene glycol monohexyl ether, diethylene glycol mono-2-ethylhexyl ether, diethylene glycol dimethyl ether (diglyme), diethylene glycol methyl ethyl ether, diethylene glycol diethyl ether, triethylene glycol monomethyl ether, triethylene glycol monoethyl ether, triethylene glycol monopropyl ether, triethylene glycol monobutyl ether, triethylene glycol monohexyl ether, triethylene glycol mono-2-ethylhexyl ether, triethylene glycol dimethyl ether (triglyme), triethylene glycol methyl ethyl ether, triethylene glycol diethyl ether, tetraethylene glycol monomethyl ether, tetraethylene glycol monoethyl ether, tetraethylene glycol monopropyl ether, tetraethylene glycol monobutyl ether, tetraethylene glycol monohexyl ether, tetraethylene glycol mono-2-ethylhexyl ether, tetraethylene glycol dimethyl ether (tetraglyme), tetraethylene glycol methyl ethyl ether, tetraethylene glycol diethyl ether, dipropylene glycol monomethyl ether, dipropylene glycol monoethyl ether, dipropylene glycol monopropyl ether, dipropylene glycol monobutyl ether, dipropylene glycol monohexyl ether, dipropylene glycol mono-2-ethylhexyl ether, tripropylene glycol monomethyl ether, tripropylene glycol monoethyl ether, tripropylene glycol monopropyl ether, tripropylene glycol monobutyl ether, tripropylene glycol monohexyl ether, tripropylene glycol mono-2-ethylhexyl ether, tetrapropylene glycol monomethyl ether, tetrapropylene glycolmonoethyl ether, tetrapropylene glycol monopropyl ether, tetrapropylene glycol monobutyl ether, tetrapropylene glycol monohexyl ether, tetrapropylene glycol mono-2-ethylhexyl ether, etc.

The content of the glycol compound or the glycol ether compound represented by general formula (VIII) in the pre-treatment liquid is preferably 50% by weight to 100% by weight, and more preferably 70% by weight to 95% by weight. If the content is less than 50% by weight, the selective dissolution characteristic for the heat sensitive layer becomes poor, and the image reproducibility declines.

It is also preferable that the pre-treatment liquid contain an amine compound as well. Although the amine compound is relatively low in the selective dissolution characteristic, the amine compound has high dissolving power for the heat sensitive layer. Therefore, an amine compound may be added as an auxiliary component into the pre-treatment liquid for the purpose of enhancing the sensitivity.

Examples of the amine compound include glycol amine compounds such as ethylene glycol amine, diethylene glycol amine, triethylene glycol amine, tetraethylene glycol amine, propylene glycol amine, dipropylene glycol amine, tripropylene glycol amine, etc., methylamine, ethylamine, dimethylamine, diethylamine, trimethylamine, triethylamine, propylamine, butylamine, amylamine, dipropylamine, dibutylamine, diamylamine, tripropylamine, tributylamine, methyldiethylamine, ethylenediamine, trimethylenediamine, tetramethylenediamine, polyethyleneimine, benzylamine, N,N-dimethylbenzylamine, N,N-diethylbenzylamine, N,N-diepropylbenzylamine, o-orm-orp-methoxy, or methylbezylamine, N,N-di(methoxybenzyl)amine, β-phenylethylamine, γ-phenylpropylamine, cyclohexylamine, aniline, monomethylaniline, dimethlaniline, toluidine, α or β-naphthylamine, o- or m- or p-phenylenediamine, aminobenzoic acid, 2-(2-aminoethyl)ethanol, 2-amino-2-methyl-1,3-propanediol, 2-amino-1,3-propanediol, 2-amino-2-hydroxymethyl-1,3-propanediol, etc.

The content of the amine compound in the pre-treatment liquid is preferably at most 25% by weight, and more preferably at most 15% by weight. If the amino compound content is greater than 25% by weight, the pre-treatment liquid's power for dissolving the heat sensitive layer becomes strong, so that not only the silicone rubber layer in the image areas but also the silicone rubber layer in the non-image areas becomes likely to fall off, and therefore reproduction of an image becomes difficult.

It is also possible to add, to the pre-treatment liquid, water, alcohols, carboxylic acids, esters, aliphatic hydrocarbons (hexane, heptane, etc.), aliphatic hydrocarbons (toluene, xylene, etc.), halogenated hydrocarbons (trichlene, etc.) as needed. In order to prevent formation of flaws or scratches on the plate surface at the time of rubbing during development, it is impossible to add a surfactant such as a sulfate salt, a phosphate salt, a carboxylate salt, a sulfonate salt, etc. into the pre-treatment liquid.

(3) Development Process

In the laser-irradiated areas, the heat sensitive layer surface is swollen or partially dissolved as a result of the pre-treatment, so that the ink repellent layer can be selectively removed with ease. Therefore, development is performed by rubbing the printing plate using water or another solvent. A development process using water is most preferable in view of discharged liquid. The pre-treatment liquid contains a hydrophilic compound as a major component. Therefore, the treatment liquid permeating in the printing plate can be rinsed with water. Hence, development using water is preferable. Development may also be carried out by jetting hot water or water vapor onto a printing plate surface. In order to increase the developability, it is also possible to use water to which a pre-treatment liquid has been added. Although the temperature of the developer is arbitrary, the temperature is preferably 10° C. to 50° C.

(4) Post-Treatment Step

In order to facilitate verification of the image areas formed by development, it is possible to adopt a post-treatment step of staining with a stain solution. As for the dye used in the stain solution, it is possible to singly use a species selected from basic dyes, acid dyes, direct dyes, disperse dyes, or use a mixture of two or more species selected from these dyes. Among them, water-soluble basic dyes and acid dyes are preferable.

Examples of the basic dyes usable include "CRYSTAL VIOLET", "ETHYL VIOLET", "VICTORIA PURE BLUE", "VICTORIA BLUE", "METHYL VIOLET", "DIABACIS MAGENTA" (by Mitsubishi Chemical Co., Ltd.), "AIZEN BASIC CYANINE 6GH" (by Hodogaya Chemical Co., Ltd.), "PRIMOCYANINE BX CONC." (by Sumitomo Chemical Co., Ltd.), "ASTRAZON BLUE G" (by FARBENFARRIKEN BAYER), "DIACRYL SUPRA BRILLIANT 2B" (by Mitsubishi Chemical Co., Ltd.), "AIZEN CATHILON TURQUOISE BLUE LH" (by Hodogaya Chemical Co., Ltd.), "AIZEN DIAMOND GREEN GH" (by Hodogaya Chemical Co., Ltd.), "AIZEN MALACHITE GREEN" (by Hodogaya Chemical Co., Ltd.), etc.

Examples of the acid dyes include "ACID VIORET 5B" (by Hodogaya Chemical Co., Ltd.), "KITON BLUE A" (by CIBA), "PATENT BLUE AF" (by BASF), "RAKUTO BRILLIANT BLUE FCF" (by Rakuto Kagakukogyo K.K.), "BRILLIANT ACID BLUE R" (by GEIGY), "KAYANOL CYANINE 6B" (by Nippon Kayaku Co.), "SUPRANOL CYANINE G" (by FARBENFARRIKEN BAYER), "ORIENT SOLUBLE BLUE OBB" (by Orient Chemical Industries Ltd.), "ACID BRILLIANT BLUE 5G" (by Chugai Kasei K.K.), "ACID BRILLIANT BLUE FFR" (by Chugai Kasei K.K.), "ACID GREEN GBH" (by Takaoka Chemical Co., ltd.), "ACID BRILLIANT MILLING GREEN B" (by Hodogaya Chemical Co., Ltd.), etc.

The content of such dyes in the stain solution is preferably 0.01% by weight to 10% by weight, and more preferably 0.1% by weight to 5% by weight.

The solvent used for the stain solution maybe water, alcohols, glycols, glycolmonoalkyl ethers, glycoldialkyl ethers, etc. These solvents may be used singly or in a mixture of two or more species. The glycols, the glycol monoalkyl ethers and the glycol dialkyl ethers have an effect of a pre-treatment liquid. Therefore, the ink repellent layer in the laser-irradiated areas can be developed in the post-treatment step even if the ink repellent layer in the laser-irradiated areas cannot be developed, but becomes deposited in the development step.

Furthermore, it is also possible to arbitrarily add a dye-assist agent, an organic acid, an inorganic acid, an anti-foam agent, a plasticizer or a surfactant.

The temperature of the stain solution is arbitrary, but is preferably 10° C. to 50° C. It is also possible to add the aforementioned dye into a developer liquid, so that the staining of the image areas can be accomplished simultaneously with the development.

(5) Rinsing Step

If the printing plate remains permeated with the pre-treatment liquid or the stain solution, the ink repellent layer in non-image areas may become prone to fall off over time. Therefore, a rinsing step of completely rinsing the treatment liquid and the stain solution from the printing plate may be adopted. The temperature of rinsing water is arbitrary, but is preferably within the range of 10° C. to 50° C.

In the foregoing development method, development can be performed manually or using an automatic processor. The manual development can be accomplished by wiping the printing plate surface sequentially with a developer-impregnated piece and a stain solution-impregnated piece of non-woven fabric, absorbent cotton, cloth, sponge, etc. If an automatic processor is used, it is preferable to adopt a processor in which a pre-treatment section, a development section and a post-treatment section are provided in that order. In some cases, a rinsing section may be provided rearward of the post-treatment section. Examples of the automatic processor include "TWL-1160" and "TWL-650" produced by Toray Industries Inc., and developer apparatuses disclosed in Japanese Patent Application Laid-Open Publication Nos. HEI4-2265, HEI5-2272 and HEI 5-6000.

The invention will be further described below in detail with reference to examples.

<Method for Measuring Transmittance of Heat Insulating Layer>

If the substrate is transparent, at first, a bare substrate is set in a spectrophotometer U-3210 (by Hitachi, Ltd.) and transmittance with respect to light of 400 to 650 rim in wavelength is measured for a reference. And subsequently the sample to be measured is set in place of the reference substrate in a spectrophotometer and transmittance with respect to light of 400 to 650 nm in wavelength is measured. The transmittance of sample subtracted with the transmittance of reference should be the transmittance of the heat insulating layer.

If the substrate is opaque, the measurement is conducted in same way except that the sample is set in the integrating sphere which is attached with the spectrophotometer U-3210 and the reflectance is measured in stead of the transmittance. Because, in reflection technique, the light that reflected at the surface of the substrate pass through the insulating layer again and then detected, the light should pass through the insulation layer twice. That is, the transmittance measured by reflection technique is the value of thickness of 2 times in comparison with transmission technique. Transmittance by reflection technique can be converted to transmittance by transmission technique using the well-known Lambert-Berr law.

<Method for Measuring Image Reproducibility>

Directly imageable waterless planographic printing plate precursors were exposed and developed so as to produce printing plates with dots of 1, 2, 3, 4, 5, 10, 20, 30, 40, 50, 60, 70, 80, 90, 95, 96, 97, 98, 99% in 2400 dpi.

The obtained printing plates were observed via a magnifying lens to check the reproducibility of each dot. If all the dots of 1 to 99% are reproduced, it can be said that good image reproducibility is achieved.

<Method for Measuring Values for Dot Area>

Directly imageable waterless planographic printing plate precursors were exposed and developed so as to produce printing plates with dots of 1, 2, 3, 4, 5, 10, 20, 30, 40, 50, 60, 70, 80, 90, 95, 96, 97, 98, 99% in 2400 dpi.

The values for dot area of the obtained printing plates were measured using a digital DotMeter "ccDot4 type 3" (by Centurfax) Measurement was conducted in perpendicular and parallel directions with respect to the aluminum stretching grains on the substrate of each printing plate. Then, differences in measurement results depending on the different directions were compared.

<Method for Measuring Range of Reflection Densities with Various Measuring Angles>

The reflection densities of the substrates and the printing plate precursors were measured by using a densitometer (MACBETH RD-918 produced by GretagMacbeth). Measurement was performed via a cyan filter. Reflection densities were measured in directions of 0°, 30°, 60°, 90°, 120°, 150°, 180°, 210°, 240°, 270°, 300° and 330° with the direction of rolling of each aluminum substrate being defined as 0°. The value obtained by subtracting the minimum value from the maximum value of the measured reflection densities was determined as a range of reflection densities with various measuring angles.

<Method for Measuring Heat Insulating Layer's Adhesion to Substrate>

After a heat insulating layer was formed on each substrate, the adhesion between the heat insulating layer and the substrate was evaluated by a cross-cut adhesion test.

51 lines were drawn at line intervals of 1 mm in the heat insulating layer with a razor blade in each of vertical and horizontal directions. Each razor-cut line reached the substrate. After a tape ("Nitto®" polyester adhesive tape No. 31B having a width of 75 mm) was adhered onto the heat insulating layer, the tape was rapidly peeled, and the state of flaking of the heat insulating layer with the cut lines was checked. If the heat insulating layer did not flake from the substrate, the adhesion was evaluated as good. If the heat insulating layer flaked and flakes adhered to the tape, the adhesion was evaluated as defective.

<Method for Measuring Hardenability of Heat Insulating Layer>

After a heat insulating layer was formed on each substrate, the hardenability of the heat insulating layer was evaluated on the basis of measurements of content of insoluble part.

After a support body provided with a heat insulating layer was dipped in a solvent (tetrahydrofuran) at 35° C. for 20 min, the support body was dried. The weight of the support body measured after the solvent dipping was compared with the weight measured before the solvent dipping.

<Method for Measuring Chemical Resistance of Heat Insulating Layer>

After a heat insulating layer was formed on each substrate, the chemical resistance of the heat insulating layer was evaluated through the use of a fastness-to-rubbing tester.

A line was drawn at a center in the sample heat insulating layer with a razorblade in a direction perpendicular to the direction of scuffing. The sample was then set in the fastness-to-rubbing tester. After the coating film was rubbed 100 times with a pad damped with acetone as a solvent, under a load of 500 g, the heat insulating layer was visually observed. If the heat insulating layer was not damaged at all, the chemical resistance was determined as good. If dissolution of the heat insulating layer by the solvent or the flaking of the heat insulating layer due to friction occurred, the chemical resistance was determined as defective.

<Method for Preparing Titanium Oxide Dispersion 1>

0.1 part by weight of a titanate coupling agent "Plenact®" KR-9SA (by Ajinomoto Fine Techno Co., inc.) was dissolved in 10 parts by weight of dimethylformamide, and 10 parts by weight of titanium oxide "CR-60" (by Ishihara Sangyo Kaisya, ltd.) was added. The mixture was then agitated for 5 minutes. Then, 15 parts by weight of glass beads (No. 08) was added, and the mixture was vigorously agitated for 20 minutes. The glass beads were then removed to obtain a titanium oxide dispersion in which titanium oxide surfaces were treated with the titanate coupling agent.

<Method for Preparing Titanium Oxide Dispersion 2>

0.5 part by weight of a titanate coupling agent "Plenact®" KR-9SA (by Ajinomoto Fine Techno Co., inc.) was dissolved in 10 parts by weight of dimethylformamide, and 10 parts by weight of titanium oxide "CR-60" (by Ishihara Sangyo Kaisya, ltd.) was added. The mixture was then agitated for 5 minutes. Then, 15 parts by weight of glass beads (No. 08) was added, and the mixture was vigorously agitated for 20 minutes. The glass beads were then removed to obtain a titanium oxide dispersion in which titanium oxide surfaces were treated with the titanate coupling agent.

<Method for Preparing Titanium Oxide Dispersion 3>

10 parts by weight of titanium oxide "CR-50" (by Ishihara Sangyo Kaisya, ltd.) was added into 10 parts by weight of dimethylformamide, and the mixture was agitated for 5 minutes. Then, 15 parts by weight of glass beads (No. 08) was added, and the mixture was vigorously agitated for 20 minutes. The glass beads were then removed to obtain a titanium oxide dispersion.

<Composition of Heat Insulating Layer Solution 1>

(a) epoxy resin: "Epikote®" 1010 (by Japan Epoxy Resins Co., ltd.): 30 parts by weight (b) polyurethane: "Sanprene®" LQT1331D (by Sanyo Chemical Industries, Ltd.): 40 parts by weight (c) aluminum tris (acetylacetonate): "Alumichelate" AL-A(W) (by Kawaken Fine Chemicals Co., ltd.): 20 parts by weight (d) vinyl-based polymer: "Disparlon®" LC951 (Kusumoto Chemical Co., ltd.): 0.1 part by weight (e) titanium oxide dispersion 1: 40 parts by weight (f) dimethylformamide: 900 parts by weight <Composition of Heat Insulating Layer Solution 2>

(a) epoxy resin: "Epikote®" 1010 (by Japan Epoxy Resins Co., ltd.): 30 parts by weight (b) polyurethane: "Sanprene®" LQT1331D (by Sanyo Chemical Industries, Ltd.): 40 parts by weight (c) aluminum tris(acetylacetonate): "Alumichelate"AL-A (W) (by Kawaken Fine Chemicals Co., ltd.): 20 parts by weight (d) vinyl-based polymer: "Disparlon®" LC951 (Kusumoto Chemical Co., ltd.): 0.1 part by weight (e) titanium oxide dispersion 3: 72 parts by weight (f) dimethylformamide: 900 parts by weight <Composition of Heat Insulating Layer Solution 3>

(a) epoxy resin: "Epikote®" 1010 (by Japan Epoxy Resins Co., ltd., epoxy equivalent of 3000 to 5000): 30 parts by weight (b) polyurethane: "Sanprene®" LQT1331D (by Sanyo Chemical Industries., Ltd.): 40 parts by weight (c) aluminum tris (acetylacetonate): "Alumichelate" AL-A(W) (by Kawaken Fine Chemicals Co., ltd.): 20 parts by weight (d) vinyl-based polymer: "Disparlon®" LC951 (Kusumoto Chemical Co., ltd.): 0.1 part by weight (e) titanium oxide dispersion 3: 72 parts by weight (f) dimethylformamide: 700 parts by weight (g) methyl ethyl ketone: 200 parts by weight <Composition of Heat Insulating Layer Solution 4>

(a) epoxy resin: "Epikote®" 1010 (by Japan Epoxy Resins Co., ltd., epoxy equivalent of 3000 to 5000): 30 parts by weight (b) polyurethane: "Sanprene®" LQT1331D (by Sanyo Chemical Industries., Ltd.): 40 parts by weight (c) aluminum tris(ethylacetoacetate): "Alumichelate" ALCH-TR (by Kawaken Fine Chemicals Co., ltd.): 8 parts by weight (d) vinyl-based polymer: "Disparlon®" LC951 (Kusumoto Chemical Co., ltd.): 0.1 part by weight (e) titanium oxide dispersion 3: 72 parts by weight (f) dimethylformamide: 700 parts by weight (g) methyl ethyl ketone: 200 parts by weight <Composition of Heat Sensitive Layer Solution>

(a) infrared-absorbing dye: "YKR-2900" (Yamamoto Chemical Industry Co., ltd.): 10 parts by weight (b) titanium di-n-butoxide bis(2,4-pentanedionate): "N̄acem® Titan" (by Nippon Kagaku Sangyo Co.): 22 parts by weight (c) phenolic novolac resin: "Sumilite Resin®" PR54652 (by Sumitomo Durez Co.): 60 parts by weight (d) polyurethane: "Sanprene®" LQT1331D (Sanyo Chemical Industries., Ltd.): 10 parts by weight (e) m-xylylenediamine/glycidyl methacrylate/3-glycidoxypropyltrimethoxysilane=1/3/1 molar ratio addition reaction product: 15 parts by weight (f) tetrahydrofuran: 800 parts by weight (g) dimethylformamide: 100 parts by weight <Composition of Silicone Rubber Layer Solution>

(a) α,ω-divinyl polydimethylsiloxane DMSV 52 (weight average molecular weight of 110,000, produced by GELEST Inc.): 100 parts by weight (b) both-terminal-methyl(methyhydrogensiloxane) (dimethylsiloxane) copolymer, SiH group-containing polysiloxane HMS-151 (molar % of MeHSiO: 15 to 18%, produced by GELEST Inc.): 7 parts by weight (c) vinyl tri(methyl ethyl ketoximine)silane: 3 parts by weight (d) platinum catalyst: "SRX-212" (Toray Dow Corning Silicone Co.): 5 parts by weight (e) "Isopar®" E (by Esso Chemical K.K.): 1035 parts by weight

EXAMPLE 1

The heat insulating layer solution 1 having the aforementioned composition was applied onto a polyethylene terephthalate film of 0.15 mm in thickness, and was dried at 160° C. for 1 minute, thus forming a heat insulating layer of 5.0 $g/m^2$. The transmittance of the film with respect to light of 400 to 650 rim in wavelength was measured via a spectrophotometer U-3210 (by Hitachi, Ltd.). The light transmittance was found to be 3% or less with respect to the entire wavelength range.

The heat insulating layer solution 1 was applied onto a degreased aluminum substrate having a thickness of 0.24 mm (produced by Mitsubishi Aluminum Co., ltd., the range of reflection densities with various measuring angles: 0.24), and was dried at 200° C. for 2 minutes, thereby forming a heat insulating layer having a film thickness of 5.0 $g/m^2$. The aforementioned heat sensitive layer solution was applied onto the heat insulating layer, and was dried to form a heat sensitive layer. The heat sensitive layer, after being dried, had a film thickness of 1.5 $g/m^2$. The heat treatment was conducted at 150° C. for 80 seconds. The aforementioned silicone rubber layer solution was applied onto the heat sensitive layer, and was dried to form a silicone rubber layer. Thus, a directly imageable waterless planographic printing plate precursor was obtained. The silicone rubber layer, after being dried, had a film thickness of 2.0 $g/m^2$. As for the drying conditions, the temperature was 125° C., and the drying time was 80 seconds.

The obtained directly imageable waterless planographic printing plate precursor was set in a plate setter "GX-3600" (by Toray Industries Inc.), and was exposed at an irradiation energy of 150 $mJ/cm^2$ using a semiconductor laser (830 nm in wavelength) Subsequently, using an automatic development device "TWL-860KII" (produced by Toray Industries Inc., with the pre-treatment liquid: NP-1 (by Toray Industries Inc.), the developer: water, the post-treatment liquid: "NA-1" (by Toray Industries Inc.)) under a condition of the pre-treatment time being 30 seconds, the exposed plate was developed, thereby obtaining a directly imageable waterless planographic printing plate.

The obtained printing plate was observed via a magnifying lens, and it was found that the printing plate reproduced dots of 1 to 99%, and thus exhibited good image reproducibility. The difference between the values for dot area measured in the perpendicular and parallel directions with respect to the aluminum stretching grain was 0.5% or less. Thus, the printing plate exhibited good dot-readability.

Furthermore, using the heat insulating layer solution let stand for 5 days, a waterless planographic printing plate was produced by a procedure similar to the above-described procedure. The printing plate was subjected to measurement of values for dot area. The dot-readability was good despite the use of the heat insulating layer solution let stand for 5 days.

EXAMPLE 2

A directly imageable waterless planographic printing plate was produced by substantially the same procedure as in Example 1, except that the amount of the titanium oxide dispersion 1 added into the heat insulating layer solution was changed from the 40 parts by weight in Example 1 to 80 parts by weight.

The obtained printing plate was observed via a magnifying lens, and it was found that the printing plate reproduced dots of 1 to 99%, and thus exhibited good image reproducibility. As for the dot-readability, the difference between the values for dot area measured in the perpendicular and parallel directions with respect to the aluminum stretching grain was 0.5% or less. Thus, the dot-readability was good.

Furthermore, using the heat insulating layer solution let stand for 5 days, a directly imageable waterless planographic printing plate was produced by a procedure similar to the above-described procedure. The printing plate was subjected to measurement of values for dot area. The dot-readability was good despite the use of the heat insulating layer solution let stand for 5 days.

EXAMPLE 3

A directly imageable waterless planographic printing plate was produced by substantially the same procedure as in Example 1, except that the titanium oxide dispersion 1 used in the heat insulating layer in Example 1 was changed to the titanium oxide dispersion 2.

The obtained printing plate was observed via a magnifying lens, and it was found that the printing plate reproduced dots of 1 to 99%, and thus exhibited good image reproducibility. As for the dot-readability, the difference between the values for dot area measured in the perpendicular and parallel directions with respect to the aluminum stretching grain was 0.5% or less. Thus, the dot-readability was good.

Furthermore, using the heat insulating layer solution let stand for 5 days, a directly imageable waterless planographic printing plate was produced by a procedure similar to the above-described procedure. The printing plate was subjected to measurement of values for dot area. The dot-readability was good despite the use of the heat insulating layer solution let stand for 5 days.

COMPARATIVE EXAMPLE 1

A directly imageable waterless planographic printing plate was produced by substantially the same procedure as in Example 1, except that the amount of the titanium oxide dispersion 1 added into the heat insulating layer solution was changed from 40 parts by weight in Example 1 to 8 parts by weight.

The obtained printing plate was observed via a magnifying lens, and it was found that the printing plate reproduced dots of 1 to 99%, and thus exhibited good image reproducibility. As for the dot-readability, both the directly imageable waterless planographic printing plate produced by using a just-prepared heat insulating layer solution and the directly imageable waterless planographic printing plate produced by using the heat insulating layer solution let stand for 5 days exhibited differences of at least 10% between the values for dot area measured in the perpendicular and parallel directions with respect to the aluminum stretching grain. Thus, the dot-readability was not good.

EXAMPLE 4

The heat insulating layer solution 2 having the aforementioned composition was applied onto a polyethylene terephthalate film of 0.15 mm in thickness, and was dried at 160° C. for 1 minute, thus forming a heat insulating layer of 5.0 $g/m^2$. The transmittance of the film with respect to light of 400 to 650 nm in wavelength was measured via a spectrophotometer U-3210 (by Hitachi, Ltd.). The light transmittance was found to be 1% or less with respect to the entire wavelength range.

Next, the heat insulating layer solution 2 having the aforementioned composition was applied onto a degreased aluminum substrate of 0.24 mm in thickness (produced by Mitsubishi Aluminum Co., ltd., the range of reflection densities with various measuring angles: 0.24), and was dried at 200° C. for 2 minutes, thereby forming a heat insulating layer having a film thickness of 5.0 $g/m^2$. The aforementioned heat sensitive layer solution was applied onto the heat insulating layer, and was dried to form a heat sensitive layer. The heat sensitive layer, after being dried, had a film thickness of 1.5 $g/m^2$. The drying conditions were 150° C. and 80 seconds. The aforementioned silicone rubber layer solution was applied onto the heat sensitive layer, and was dried to form a silicone rubber layer. Thus, a directly imageable waterless planographic printing plate precursor was obtained. The silicone rubber layer, after being dried, had a film thickness of 2.0 $g/m^2$. The drying conditions were 125° C. and 80 seconds.

The thus-produced directly imageable waterless planographic printing plate precursor was subjected to measurement of the range of reflection densities with various measuring angles. The range of reflection densities with various measuring angles was found to be "0".

The obtained directly imageable waterless planographic printing plate precursor was set in a plate setter "GX-3600" (by Toray Industries Inc.), and was exposed at an irradiation energy of 150 $mJ/cm^2$ using a semiconductor laser (830 nm in wavelength). Subsequently, using an automatic development device "TWL-860KII" (produced by Toray Industries Inc., with the pre-treatment liquid: NP-1 (by Toray Industries Inc.), the developer: water, the post-treatment liquid: "NA-1" (by Toray Industries Inc.)) under a condition of the pre-treatment time being 30 seconds, the exposed plate was developed, thereby obtaining a directly imageable waterless planographic printing plate.

The obtained printing plate was observed via a magnifying lens, and it was found that the printing plate reproduced dots of 1 to 99%, and thus exhibited good image reproducibility. The difference between the values for dot area measured in the perpendicular and parallel directions with respect to the aluminum stretching grain was 0.5% or less. Thus, the printing plate exhibited good dot-readability.

EXAMPLE 5

A heat insulating layer coating film and a directly imageable waterless planographic printing plate were obtained through substantially the same procedures as in Example 4, except that the amount of the titanium oxide dispersion 3 added into the heat insulating layer solution was changed from 72 parts by weight in Example 4 to 48 parts by weight.

The transmittance of the heat insulating layer coating film with respect to light of 400 to 650 nm in wavelength was 2% or less with respect to the entire wavelength range.

The range of reflection densities with various measuring angles regarding the obtained directly imageable waterless planographic printing plate precursor was 0.01. After the exposure and development, the printing plate was observed via a magnifying lens. It was found that the printing plate reproduced dots of 1 to 99%, and thus exhibited good image reproducibility. As for the dot-readability, the difference between the values for dot area measured in the perpendicular and parallel directions with respect to the aluminum stretching grain was 0.5% or less. Thus, the dot-readability was good.

EXAMPLE 6

A heat insulating layer coating film and a directly imageable waterless planographic printing plate were obtained through substantially the same procedures as in Example 4, except that the amount of the titanium oxide dispersion 3 added into the heat insulating layer solution was changed from 72 parts by weight in Example 4 to 24 parts by weight.

The transmittance of the heat insulating layer coating film with respect to light of 400 to 650 nm in wavelength was 12% or less with respect to the entire wavelength range.

The range of reflection densities with various measuring angles regarding the obtained directly imageable waterless planographic printing plate precursor was 0.01. After the exposure and development, the printing plate was observed via a magnifying lens. It was found that the printing plate reproduced dots of 1 to 99%, and thus exhibited good image reproducibility. As for the dot-readability, the difference between the values for dot area measured in the perpendicular and parallel directions with respect to the aluminum stretching grain was 1.0% or less. Thus, the dot-readability was good.

COMPARATIVE EXAMPLE 2

A heat insulating layer coating film and a directly imageable waterless planographic printing plate were obtained through substantially the same procedures as in Example 4, except that the amount of the titanium oxide dispersion 3 added into the heat insulating layer solution was changed from 72 parts by weight in Example 4 to 8 parts by weight.

The transmittance of the heat insulating layer coating film with respect to light of 400 to 650 nm in wavelength was 30% or higher.

The range of reflection densities with various measuring angles regarding the obtained directly imageable waterless planographic printing plate precursor was 0.05. After the exposure and development, the printing plate was observed via a magnifying lens. It was found that the printing plate reproduced dots of 1 to 99%, and thus exhibited good image reproducibility. As for the dot-readability, the difference between the values for dot area measured in the perpendicular and parallel directions with respect to the aluminum stretching grain was 5% or greater. Thus, the dot-readability was not good.

COMPARATIVE EXAMPLE 3

A heat insulating layer coating film and a directly imageable waterless planographic printing plate were obtained through substantially the same procedures as in Example 4, except that the amount of the titanium oxide dispersion 3 added into the heat insulating layer solution was changed from 72 parts by weight in Example 4 to 0 part by weight.

The transmittance of the heat insulating layer coating film with respect to light of 400 to 650 nm in wavelength was 90% or higher.

The range of reflection densities with various measuring angles regarding the obtained directly imageable waterless planographic printing plate precursor was 0.24. After the exposure and development, the printing plate was observed via a magnifying lens. It was found that the printing plate reproduced dots of 1 to 99%, and thus exhibited good image reproducibility. As for the dot-readability, the difference between the values for dot area measured in the perpendicular and parallel directions with respect to the aluminum stretching grain was 10% or greater. Thus, the dot-readability was not good.

<<Investigation of Epoxy Resin and Aluminum Chelate Compound>>

EXAMPLE 7

The heat insulating layer solution 3 having the aforementioned composition was applied onto a polyethylene terephthalate film of 0.15 mm in thickness, and was dried at 160° C. for 1 minute, thus forming a heat insulating layer of 5.0 $g/m^2$. The transmittance of the film with respect to light of 400 to 650 nm in wavelength was measured via a spectrophotometer U-3210 (by Hitachi, Ltd.). The light transmittance was found to be 1% or less with respect to the entire wavelength range.

The heat insulating layer solution 3 having the aforementioned composition was applied onto a degreased aluminum substrate of 0.24 mm in thickness (produced by Mitsubishi Aluminum Co., ltd., the range of reflection densities with various measuring angles: 0.24), and was dried at 220° C. for 1 minute, thereby forming a heat insulating layer having a film thickness of 5.0 $g/m^2$.

Regarding the heat insulating layer formed, the adhesion to the substrate, the hardenability and the chemical resistance were evaluated. Across-cut adhesion test showed that the heat insulating layer exhibited no flaking, and had good adhesion to the substrate. The content of insoluble part of the coating film was 98.5%, indicating good hardenability. After 100 times of rubbing with acetone, the heat insulating layer had no damage, thus exhibiting good chemical resistance.

The aforementioned heat sensitive layer solution was applied on to the heat insulating layer, and was dried to form a heat sensitive layer. The heat sensitive layer, after being dried, had a film thickness of 1.5 $g/m^2$. The drying conditions were 150° C. and 80 seconds.

Using this laminate, the adhesion between the heat sensitive layer and the heat insulating layer was evaluated by a cross-cut adhesion test. As a result, the heat sensitive layer exhibited no flaking, and had good adhesion. The cross-cut adhesion test in this case was performed in substantially the same method as the above-described test method for the heat insulating layer's adhesion to the substrate, The aforementioned silicone rubber layer solution was applied onto the heat sensitive layer, and was dried to form a silicone rubber layer. Thus, a directly imageable waterless planographic printing plate precursor was obtained. The silicone rubber layer, after being dried, had a film thickness of 2.0 $g/m^2$. The drying conditions were 125° C. and 80 seconds.

The obtained directly imageable waterless planographic printing plate precursor was set in a plate setter "GX-3600" (by Toray Industries Inc.), and was exposed at an irradiation energy of 150 $mJ/cm^2$ using a semiconductor laser (830 nm in wavelength). Subsequently, using an automatic development device "TWL-860KII" (produced by Toray Industries Inc., with the pre-treatment liquid: NP-1 (by Toray Industries Inc.), the developer: water, the post-treatment liquid: "NA-1" (by Toray Industries Inc.)) under a condition of the pre-treatment time being 30 seconds, the exposed plate was developed, thereby obtaining a directly imageable waterless planographic printing plate.

The obtained printing plate was observed via a magnifying lens, and it was found that the printing plate reproduced dots of 1 to 99%, and thus exhibited good image reproducibility. As for the dot-readability, the difference between the values for dot area measured in the perpendicular and parallel directions with respect to the aluminum stretching grain was 0.5% or less. Thus, the printing plate exhibited good dot-readability.

EXAMPLE 8

Substantially the same experiments as in Example 7 were conducted, except that the epoxy resin "Epikote®" 1010 in the heat insulating layer solution in Example 7 was changed to "Epikote®" 1256 (by Japan Epoxy Resins Co., ltd., the epoxy equivalent: 7000 to 8500).

A cross-cut adhesion test of the heat insulating layer showed that the heat insulating layer exhibited no flaking, and had good adhesion to the substrate. The content of insoluble part of the coating film was 99.0%, indicating good hardenability. After 100 times of rubbing with acetone, the heat insulating layer had no damage, thus exhibiting good chemical resistance.

A heat sensitive layer was formed on the heat insulating layer substantially in the same manner as in Example 7. The adhesion between the heat sensitive layer and the heat insulating layer was evaluated by a cross-cut adhesion test. As a result, the heat sensitive layer exhibited no flaking, and had good adhesion.

A directly imageable waterless planographic printing plate was obtained in substantially the same manner as in Example 7. The obtained printing plate reproduced dots of 1 to 99%, exhibiting good image reproducibility. As for the dot-readability, the difference between the values for dot area measured in the perpendicular and parallel directions with respect to the aluminum stretching grain was 0.5% or less. Thus, the printing plate exhibited good dot-readability.

EXAMPLE 9

Substantially the same experiments as in Example 7 were conducted, except that the aluminum tris(acetylacetonate) "Alumichelate" AL-A(W) (by Kawaken Fine Chemicals Co., ltd.) in the heat insulating layer solution in Example 7 was changed to aluminum tris(ethylacetoacetate) "Alumichelate" ALCH-TR (by Kawaken Fine Chemicals Co., ltd.).

A cross-cut adhesion test of the heat insulating layer showed that the heat insulating layer exhibited no flaking, and had good adhesion to the substrate. The content of insoluble part of the coating film was 99.0%, indicating good hardenability. After 100 times of rubbing with acetone, the heat insulating layer had no damage, thus exhibiting good chemical resistance.

A heat sensitive layer was formed on the heat insulating layer in substantially the same manner as in Example 7. The adhesion between the heat sensitive layer and the heat insulating layer was evaluated by a cross-cut adhesion test. As a result, the heat sensitive layer exhibited no flaking, and had good adhesion.

A printing plate having the aforementioned heat insulating layer reproduced dots of 1 to 99%, exhibiting good image reproducibility. As for the dot-readability, the difference between the values for dot area measured in the perpendicular and parallel directions with respect to the aluminum stretching grain was 0.5% or less. Thus, the printing plate exhibited good dot-readability.

<<Investigation of Aluminum Chelate Compound>>

EXAMPLE 10

The heat insulating layer solution 3 having the aforementioned composition was applied onto a polyethylene terephthalate film of 0.15 mm in thickness, and was dried at 160° C. for 1 minute, thus forming a heat insulating layer of 5.0 g/m$^2$. The transmittance of the film with respect to light of 400 to 650 nm in wavelength was measured via a spectrophotometer U-3210 (by Hitachi, Ltd.). The light transmittance was found to be 1% or less with respect to the entire wavelength range.

The heat insulating layer solution 4 having the aforementioned composition was applied onto a degreased aluminum substrate of 0.24 mm in thickness (produced by Mitsubishi Aluminum Co., ltd., the range of reflection densities with various measuring angles: 0.24), and was dried at 220° C. for 1 minute, thereby forming a heat insulating layer having a film thickness of 5.0 g/m$^2$.

Regarding the heat insulating layer, the adhesion to the substrate, the hardenability and the chemical resistance were evaluated. Across-cut adhesion test showed that the heat insulating layer exhibited no flaking, and had good adhesion to the substrate. The content of insoluble part of the coating film was 98.5%, indicating good hardenability. After 100 times of rubbing with acetone, the heat insulating layer had no damage, thus exhibiting good chemical resistance.

The heat insulating layer solution was applied onto a polyethylene terephthalate film of 150 μm in thickness ("Lumirror®" produced by Toray Industries Inc.) at room temperature, and was cured at a cure temperature of 40° C. for a cure time of 1 minute, thereby forming a heat insulating layer. The aluminum atom content in the produced heat insulating layer was measured in the measurement conditions indicated below, and was found to be 11706 cps. With regard to a heat insulating layer produced in the conditions of the cure temperature being 230° C. and the cure time being 1 minute, the aluminum atom content was 11697 cps. The proportion of the aluminum atom content in the heat insulating layer produced in the conditions of the cure temperature being 230° C. and the cure time being 1 minute to the aluminum atom content in the heat insulating layer produced in the conditions of the cure temperature being 40° C. and the cure time being 1 minute was 99.9%.

Measurement device: Automatic X-ray Fluorescence Spectrometer RIX 3000 by Rigaku Corporation Measurement conditions X-ray tube: Rh tube voltage/tube current: 50 kV/50 mA analytical line: Al-Kα dispersive crystal: PET detector: gas flow proportional counter measurement atmosphere: vacuum measuring surface: 30 mmφ

Sample preparation and measurement: Sample pieces of about 35 mm per side were fixed to measuring sample cells. Each sample was subjected to measurement repeatedly twice (a fixed time count method, a count time of 40 seconds).

Subsequently, the aforementioned heat sensitive layer solution was applied onto the heat insulating layer, and was dried to form a heat sensitive layer. After the drying, the film thickness was 1.5 g/m$^2$. The drying conditions were 150° C. and 80 seconds.

Using this laminate, the adhesion between the heat sensitive layer and the heat insulating layer was evaluated by a cross-cut adhesion test. As a result, the heat sensitive layer exhibited no flaking, and had good adhesion.

The aforementioned silicone rubber layer solution was applied onto the heat sensitive layer, and was dried to form a silicone rubber layer. Thus, a directly imageable waterless planographic printing plate precursor was obtained. The silicone rubber layer, after being dried, had a film thickness of 2.0 g/m$^2$. The drying conditions were 125° C. and 80 seconds.

The obtained directly imageable waterless planographic printing plate precursor was set in a processor "GX-3600" (by Toray Industries Inc.), and was exposed at an irradiation energy of 150 $mJ/cm^2$ using a semiconductor laser (830 nm in wavelength). Subsequently, using an automatic processor "TWL-860KII" (produced by Toray Industries Inc., with the pre-treatment liquid: NP-1 (by Toray Industries Inc.), the developer: water, the post-treatment liquid: "NA-1" (by Toray Industries Inc.)) under a condition of the pre-treatment time being 30 seconds, the exposed plate was developed, thereby obtaining a directly imageable waterless planographic printing plate.

The obtained printing plate was observed via a magnifying lens, and it was found that the printing plate reproduced dots of 1 to 99%, and thus exhibited good image reproducibility. As for the dot-readability, the difference between the values for dot area measured in the perpendicular and parallel directions with respect to the aluminum stretching grain was 0.5% or less. Thus, the printing plate exhibited good dot-readability.

Furthermore, the above-described production of the directly imageable waterless planographic printing plate precursor was continuously performed for a long time, and no problem occurred.

EXAMPLE 11

Substantially the same experiments as in Example 10 were conducted, except that the amount of aluminum tris (ethylacetoacetate) "Alumichelate" ALCH-TR added into the heat insulating layer solution was changed to 15 parts by weight.

A cross-cut adhesion test of the heat insulating layer showed that the heat insulating layer exhibited no flaking, and had good adhesion to the substrate. The content of insoluble part of the coating film was 99.0%, indicating good hardenability. After 100 times of rubbing with acetone, the heat insulating layer had no damage, thus exhibiting good chemical resistance.

A heat sensitive layer was formed on the heat insulating layer substantially in the same manner as in Example 10. The adhesion between the heat sensitive layer and the heat insulating layer was evaluated by a cross-cut adhesion test. As a result, the heat sensitive layer exhibited no flaking, and had good adhesion.

A directly imageable waterless planographic printing plate was obtained substantially in the same manner as in Example 10. The obtained printing plate reproduced dots of 1 to 99%, exhibiting good image reproducibility. As for the dot-readability, the difference between the values for dot area measured in the perpendicular and parallel directions with respect to the aluminum stretching grain was 0.5% or less. Thus, the printing plate exhibited good dot-readability.

Similarly to Example 11, the heat insulating layer solution was applied onto a polyethylene terephthalate film of 150 μm in thickness ("Lumirror®" produced by Toray Industries Inc.), and was cured at a cure temperature of 40° C. for a cure time of 1 minute, thereby forming a heat insulating layer. The aluminum atom content in the produced heat insulating layer was measured, and was found to be 15582 cps. With regard to a heat insulating layer produced in the conditions of the cure temperature being 230° C. and the cure time being 1 minute, the aluminum atom content was 15178 cps. The proportion of the aluminum atom content in the heat insulating layer produced in the conditions of the cure temperature being 230° C. and the cure time being 1 minute to the aluminum atom content in the heat insulating layer produced in the conditions of the cure temperature being 40° C. and the cure time being 1 minute was 97.4%.

Furthermore, the above-described production of the directly imageable waterless planographic printing plate precursor was continuously performed for a long time, and no problem occurred.

TABLE 1

| | Volume concentration of titanium oxide | Light transmittance of heat insulating layer | Range of reflection densities with various measuring angles | Image reproducibility (dot reproducibility) | Dot-readability |
|---|---|---|---|---|---|
| Example 1 | 5% | ≦3% | 0.01 | 1–99% | ≦0.5% |
| Example 2 | 10% | ≦1% | 0 | 1–99% | ≦0.5% |
| Example 3 | 5% | ≦3% | 0.01 | 1–99% | ≦0.5% |
| Example 4 | 9% | ≦1% | 0 | 1–99% | ≦0.5% |
| Example 5 | 6% | ≦2% | 0.01 | 1–99% | ≦0.5% |
| Example 6 | 3% | ≦12% | 0.01 | 1–99% | ≦1.0% |
| Example 7 | 9% | ≦1% | 0 | 1–99% | ≦0.5% |
| Example 8 | 9% | ≦1% | 0 | 1–99% | ≦0.5% |
| Example 9 | 9% | ≦1% | 0 | 1–99% | ≦0.5% |
| Example 10 | 10% | ≦1% | 0 | 1–99% | ≦0.5% |
| Example 11 | 9.5% | ≦1% | 0 | 1–99% | ≦0.5% |
| Comparative Example 1 | 1% | ≧30% | 0.05 | 1–99% | ≧10.0% |
| Comparative Example 2 | 1% | ≧30% | 0.05 | 1–99% | ≧5.0% |
| Comparative Example 3 | 0% | ≧90% | 0.24 | 1–99% | ≧10.0% |

According to the invention, a directly imageable waterless planographic printing plate precursor that allows measurement of the dot area ratio on the printing plate with a densitometer or the like can be provided. The use of the directly imageable waterless planographic printing plate precursor of the invention enables the proofing by reading a printing plate with a measuring apparatus.

What is claimed is:

1. A directly imageable waterless planographic printing plate precursor comprising: at least a heat insulating layer, a heat sensitive layer, and an ink repellent layer that are provided in that order on a substrate, wherein a transmittance of the heat insulating layer for a light having a wavelength within a range of 400 to 650 nm is at most 5% over the entire range of the wavelength.

2. The directly imageable waterless planographic printing plate precursor according to claim 1, wherein a range of reflection densities with various measuring angles is less than 0.04.

3. The directly imageable waterless planographic printing plate precursor according to claim 1, wherein the heat insulating layer contains an epoxy resin and a metal chelate compound.

4. The directly imageable waterless planographic printing plate precursor according to claim 1, wherein the heat insulating layer contains at least 2% by volume of titanium oxide particles.

5. The directly imageable waterless planographic printing plate precursor according to claim 4, wherein the titanium oxide particles are treated with a titanate-based coupling agent.

6. The directly imageable waterless planographic printing plate precursor according to claim 1, wherein the substrate is an aluminum substrate.

7. The directly imageable waterless planographic printing plate precursor according to claim 1, wherein a range of reflection densities with various measuring angles of the substrate is at least 0.1.

* * * * *